United States Patent
Paranjpe et al.

(10) Patent No.: US 9,978,934 B2
(45) Date of Patent: May 22, 2018

(54) ION BEAM ETCHING OF STT-RAM STRUCTURES

(71) Applicant: Veeco Instruments, Inc., Plainview, NY (US)

(72) Inventors: Ajit Paranjpe, Basking Ridge, NJ (US); Boris Druz, Brooklyn, NY (US); Katrina Rook, Jericho, NY (US); Narasimhan Srinivasan, Commack, NY (US)

(73) Assignee: VEECO Instruments Inc., Plainview, NY (US)

( * ) Notice: Subject to any disclaimer, the term of this patent is extended or adjusted under 35 U.S.C. 154(b) by 0 days. days.

(21) Appl. No.: 14/927,604

(22) Filed: Oct. 30, 2015

(65) Prior Publication Data

US 2017/0125668 A1 May 4, 2017

(51) Int. Cl.
| | |
|---|---|
| *H01L 43/12* | (2006.01) |
| *H01L 43/08* | (2006.01) |
| *H01L 43/00* | (2006.01) |
| *H01L 43/02* | (2006.01) |

(52) U.S. Cl.
CPC .............. *H01L 43/12* (2013.01); *H01L 43/00* (2013.01); *H01L 43/02* (2013.01); *H01L 43/08* (2013.01)

(58) Field of Classification Search
None
See application file for complete search history.

(56) References Cited

U.S. PATENT DOCUMENTS

| | | | |
|---|---|---|---|
| 6,984,529 B2 | 1/2006 | Stojakovic et al. | |
| 2007/0266549 A1* | 11/2007 | Gill | B82Y 10/00 29/603.12 |
| 2013/0052752 A1 | 2/2013 | Satoh et al. | |
| 2014/0017817 A1* | 1/2014 | Godet | H01L 43/12 438/3 |
| 2014/0131308 A1* | 5/2014 | Gouk | G11B 5/855 216/22 |
| 2014/0170776 A1 | 6/2014 | Satoh et al. | |

(Continued)

OTHER PUBLICATIONS

Nagahara, Kiyokazu et al., "Magnetic Tunnel Junction (MTJ) Patterning for Magnetic Random Access Memory (MRAM) Process Applications" Jpn. J. Appl. Phys. vol. 42 (2003) pp. L499-L501 Part 2, No. 5B, May 15, 2003.

(Continued)

*Primary Examiner* — Peter Bradford
(74) *Attorney, Agent, or Firm* — Holzer Patel Drennan

(57) ABSTRACT

This disclosure provides various methods for improved etching of spin-transfer torque random access memory (STT-RAM) structures. In one example, the method includes (1) ion beam etch of the stack just past the MTJ at near normal incidence, (2) a short clean-up etch at a larger angle in a windowed mode to remove any redeposited material along the sidewall that extends from just below the MTJ to just above the MTJ, (3) deposition of an encapsulant with controlled step coverage to revert to a vertical or slightly re-entrant profile from the tapered profile generated by the etch steps, (4) ion beam etch of the remainder of the stack at near normal incidence while preserving the encapsulation along the sidewall of the MTJ, (5) clean-up etch at a larger angle and windowed mode to remove redeposited materials from the sidewalls, and (6) encapsulation of the etched stack.

14 Claims, 28 Drawing Sheets

(56) References Cited

U.S. PATENT DOCUMENTS

| 2015/0069547 | A1* | 3/2015 | Iwayama | H01L 43/02 |
| | | | | 257/421 |
| 2016/0087195 | A1* | 3/2016 | Sonoda | H01L 43/12 |
| | | | | 438/3 |
| 2016/0126454 | A1* | 5/2016 | Mudivarthi | H01L 43/12 |
| | | | | 438/3 |

OTHER PUBLICATIONS

Sugiura, Kuniaki et al., "Ion Beam Etching Technology for High-Density Spin Transfer Torque Magnetic Random Access Memory" Japan Journal of Applied Physics 48 (2009) 8HD02, 4 pages.

* cited by examiner $\tan \alpha = d/h$

ION BEAM ETCHING OF STT-RAM STRUCTURES

BACKGROUND

Spin-transfer torque (STT) random access memory (RAM) is a potential alternative to on-chip SRAM for mobile applications, and as a replacement for DRAM and NOR-flash. It offers the attributes of fast read-write, high endurance, and non-volatility with good endurance and low power consumption.

One of the major challenges facing STT-RAM involves the patterning of the magnetic stack in a dense array. Electrically conductive non-volatile by-products condense on the sidewall of the structure and electrically shunt the magnetic tunnel junction. In addition, as the dimension of the device is scaled to below 40 nm in width, etch-induced damage edge of the magnetic tunnel junction degrades the performance of the device. Finally, for dense structures, near vertical sidewalls are desired to ensure electrical isolation between adjacent bits. Thus, there is an urgent need to develop a non-damaging etch process to pattern the STT-RAM stack, especially as the dimensions are scaled down from 40 nm to sub 20 nm.

SUMMARY

In one implementation, this disclosure provides a method of fabricating a magnetic tunnel junction (MTJ) device by: providing an initial structure comprising an MTJ stack; etching the structure just past the MTJ stack where the etching is performed at a near normal incidence angle; performing a clean-up etch to remove redeposited material from sidewalls of the MTJ stack that extend from just below the MTJ to just above the MTJ; depositing an encapsulation layer over the cleaned up etched sidewalls; etching the remainder of the structure at a near normal incidence angle while ensuring that the encapsulation layer on the sidewall of the MTJ stack is mostly preserved; performing a clean-up etch to remove a majority of redeposited materials from the sidewalls of the MTJ stack; and encapsulating the etched stack to avoid corrosion upon air exposure.

In another implementation, this disclosure provides a method of patterning an STT-RAM structure having a magnetic tunnel junction (MTJ) stack comprising: etching the structure just past the MTJ stack where the etching is performed at a near normal incidence angle; performing a clean-up etch at an angle greater than near normal incidence to remove redeposited material from sidewalls of the MTJ stack that extend from just below the MTJ to just above the MTJ; depositing electrically insulating etch stop material over the cleaned up etched MTJ sidewalls; etching the remainder of the structure at a near normal incidence angle while ensuring that the encapsulation layer on the sidewall of the MTJ stack is mostly preserved; performing a clean-up etch at an angle greater than near normal incidence to remove a majority of redeposited materials from the sidewalls of the MTJ stack; and encapsulating the etched stack to avoid corrosion upon air exposure.

In yet another implementation, this disclosure provides a method of patterning an STT-RAM structure having a magnetic tunnel junction (MTJ) stack comprising: etching the structure just past the MTJ stack where the etching is performed at a near normal incidence angle; performing a first clean-up etch at an angle greater than near normal incidence to remove redeposited material from sidewalls of the MTJ stack that extend from just below the MTJ to just above the MTJ, the first clean-up etch performed over a sweep angle centered at 90° increments starting at 45° when the structure is rotated (e.g., for a square pattern with four-fold symmetry aligned along 0° and 90°); depositing an electrically insulating etch stop material over the cleaned up etched MTJ sidewalls; etching the remainder of the structure at a near normal incidence angle while ensuring that the encapsulation layer on the sidewall of the MTJ stack is mostly preserved; and performing a second clean-up etch at an angle greater than near normal incidence to remove a majority of redeposited materials from the sidewalls of the MTJ stack, the second clean-up etch performed over a sweep angle centered at 90° increments starting at 45° when the structure is rotated.

In some implementations, the encapsulation layer is deposited at an angle with an optional sweep to selectively coat the sidewalls of the mask. Such a deposition returns the mask sidewall angle to vertical or slightly re-entrant.

In yet other implementations, this disclosure provides a method of patterning an STT-RAM structure having a magnetic tunnel junction (MTJ) stack, the method includes one or all of (1) an intermediate encapsulation step, (2) windowed redeposition removal step, (3) angled deposition to maintain profile and (4) use of a DLC hard mask.

For example, one method of patterning an STT-RAM structure having a MTJ stack comprises etching the structure to a pre-determined depth to provide etched sidewalls, depositing an encapsulation layer over the etched sidewalls, and etching the structure having the encapsulation layer.

Another example of a method of patterning an STT-RAM structure having a MTJ stack comprises etching the structure to a pre-determined depth, and after etching, performing a clean-up etch using an ion beam at an angle greater than near normal incidence and within particular angular orientations relative to the initial structure.

Yet another example of a method of patterning an STT-RAM structure having a MTJ stack comprises etching the structure to a pre-determined depth to provide etched sidewalls, depositing an encapsulation layer using a directional deposition method over the etched sidewalls, and etching the structure having the encapsulation layer.

Yet another example of a method of patterning an STT-RAM structure having a MTJ stack comprises providing an initial structure comprising an MTJ stack with a hard mask that incorporates diamond like carbon, and etching the structure.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. These and various other features and advantages will be apparent from a reading of the following Detailed Description.

BRIEF DESCRIPTIONS OF THE DRAWINGS

DETAILED DESCRIPTION

Figure 1:
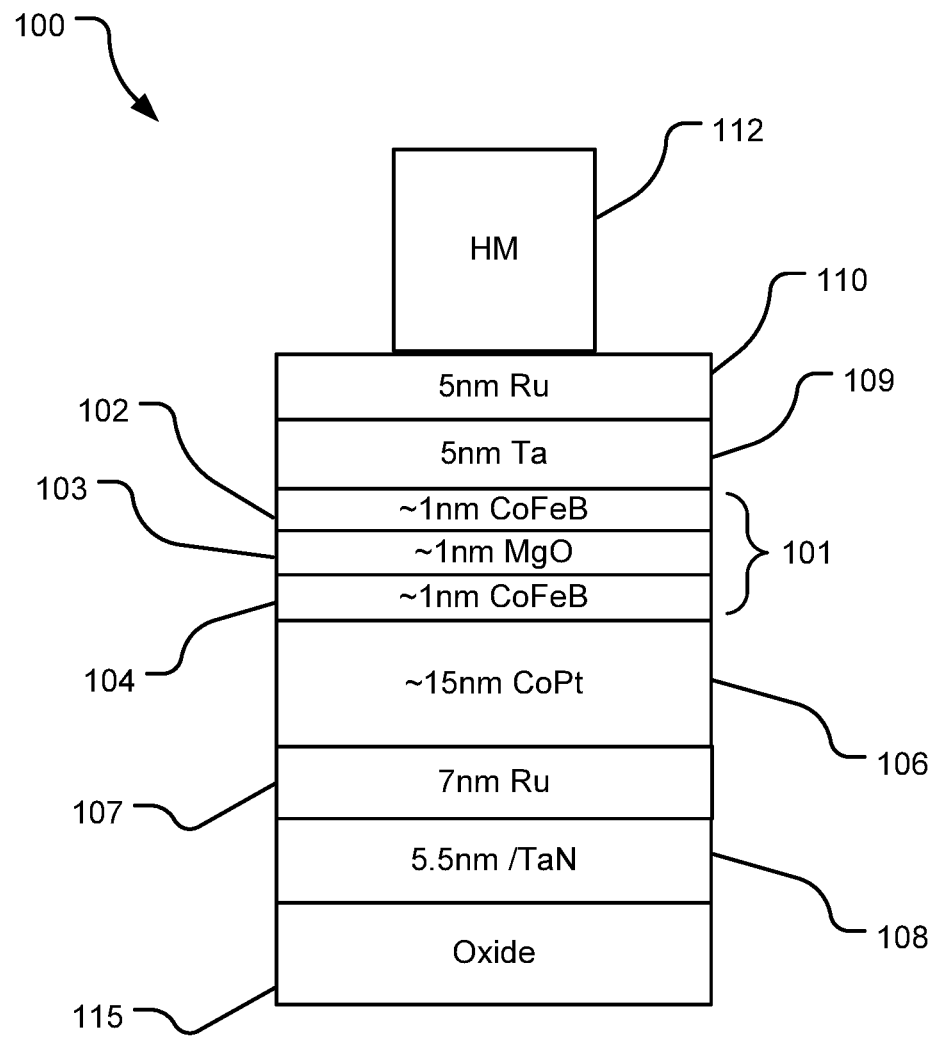
FIG. 1 is a schematic diagram of an example STT-RAM structure, having a MTJ stack, prior to being etched.

This disclosure provides various methods for improved etching of spin-transfer torque random access memory (STT-RAM) structures or stacks.

In one implementation, the method includes (1) ion beam etch of the stack just past the magnetic tunnel junction (MTJ) with the etch performed at near normal incidence, (2) a short clean-up etch at a larger angle in a windowed mode to remove any redeposited material along the sidewall that extends from just below the MTJ to just above the MTJ, (3) deposition of an encapsulation with controlled step coverage to revert to a vertical or slightly re-entrant profile from the tapered profile generated by the IBE etch steps, (4) ion beam etch of the remainder of the stack at near normal incidence while ensuring that the encapsulation along the sidewall of the MTJ is mostly preserved, (5) clean-up etch at a larger angle and windowed mode to remove majority of the redeposited materials from the sidewalls, and (6) encapsulation of the etched stack to avoid corrosion upon air exposure.

By use of the phrase "near normal" and variations thereof, what is intended is within 10° of normal, in some implementations within 7° of normal and in other implementations within 5° of normal. By "greater than near normal" and variations thereof, what is intended is greater than 10°.

Throughout this discussion, when terms such as "mostly," "majority,", or "predominantly" are used, such as in reference to removal or maintenance of a feature (e.g., an encapsulation layer, or a redeposited material), what is intended is at least one half or 50%, in some implementations at least 75%, in other implementations at least 85%, and in yet other implementations at least 90% or at least 95%.

Another method is for extension of patterning to on-pitch geometries (i.e. pillar diameter and space between adjacent pillars is similar). Such a method includes (1) removal of the hard mask that is used to pattern the top electrode by RIE, (2) capping of the structure with a ion beam deposited diamond like carbon film in an angled deposition mode and optionally with windowing to achieve a controlled step coverage that reverts the sidewall to a vertical or slightly re-entrant profile from the tapered profile generated by the RIE etch step, (3) ion beam etch of the stack at near normal incidence with argon or neon to etch through the magnetic stack and some distance into the underlying material, (4) clean-up etch at a larger angle and windowed mode to remove majority of the redeposited materials from the sidewalls, (5) low energy ion beam oxidation or natural oxidation of the magnetic stack to oxidize any trace amounts of redeposition that remains, and (6) encapsulation of the etched stack to avoid corrosion upon air exposure.

Yet another method is for extension of patterning to on-pitch geometries (i.e. pillar diameter and space between adjacent pillars is similar). Such a method includes (1) partial replacement of the hard mask that is used to pattern the top electrode by RIE with an ion beam deposited diamond like carbon film, (2) ion beam etch of the stack at near normal incidence with argon or neon to etch through the magnetic stack and some distance into the underlying material, (3) clean-up etch at a larger angle using a divergent beam or a windowed mode to remove majority of the redeposited materials from the sidewalls, (4) low energy ion beam oxidation or natural oxidation of the magnetic stack to oxidize any trace amounts of redeposition that remains, and (5) encapsulation of the etched stack to avoid corrosion upon air exposure. Encapsulation can also consist of an ion beam deposited film such as diamond like carbon or aluminum oxide both of which are good corrosion barriers capped with a thicker layer of conventional passivation such as SiN and/or $SiO_2$.

In one particular implementation, the disclosure provides a method of STT-RAM magnetic stack patterning on the wafer, the method comprising:
  ion beam etch the stack using a near-normal low energy ion beam etch stopping just past the magnetic tunnel junction;
  clean-up ion beam etch at a larger angle to remove any redeposited material along the sidewall that extends from just below the MTJ to just above the MTJ;

deposit a thin electrically insulating etch stop using IBD, PVD, conformal PVD, or PECVD;

etch the remainder of the stack stopping just past the bottom of the stack with subsequent clean-up at larger angle; and deposit an encapsulation over the etched stack;

wherein:

clean-up ion beam etch at a larger angle is being performed in window that represents the range of angles over which the wafer is etched. The range is centered about a rotation angle of 45°, 135°, 225° and 315° (windowed etch)

deposit encapsulation coating in 2 sub-steps:

1st sub-step—deposition of near conformal, or conformal insulating layer;

2nd sub-step—selective deposition of a layer on HM near the top. It prevents facet formation on the HM, and sustain near vertical walls of the structure. This sub-step can be performed by directional deposition methods such as PVD, or IBD. Selectively deposited material can be the same as the conformal layer, or material that has lower sputtering yield;

etch remainder of the stack stopping just past the bottom of the stack using a near-normal low energy (<200 V) ion beam etch;

perform a windowed clean-up etch at a larger angle;

terminate with an oxidizing low energy beam (e.g. 50 V) to convert any residual redeposition to an insulating oxide.

In another particular implementation, the disclosure provides a method of patterning an STT-RAM structure having a MTJ stack by using a collimated large area gridded ion beam source for etching of the structure. This may be done by combined ion beam etch (IBE) from, e.g., an inert gas plasma, and reactive ion beam etch (RIBE), e.g., from plasma, which can be any mixture of inert gas, halocarbon, etc. The method also includes clean-up of the structure by ion beam inert gas plasma. Subsequently, the structure can be encapsulated via diamond like carbon (DLC) coating deposition, e.g., by direct ion beam using hydrocarbon plasma.

In some implementations, the processing of the initial structure having the MTJ stack includes etching of the structure by combined ion beam etch (IBE) from inert gas plasma and reactive ion beam etch (RIBE) from mixture of plasma based on inert gas, halocarbon, etc. Clean-up of the structure can be by ion beam inert gas plasma. The structure can be encapsulated by DLC coating deposition from direct ion beam using hydrocarbon plasma. Any or all of these processes can be performed in the same chamber.

In some implementations, the ion beam etch uses a near-normal low energy beam from inert gas plasma, wherein the inert gas used is neon and/or argon, and the ion beam etch of the barrier layer is performed with a mixture of inert gas with an oxidizing gas ($O_2$) up to the spacer layer.

The main etch can additionally or alternately be performed in a windowed mode to allow for larger etch angles. For such an implementation, the azimuthal rotation angles are chosen such that the beam is not shadowed by the surrounding pillars. For the square pattern of FIG. 6, these would be angles of 0°, 90°, 180° and 270° since the surrounding pillars would obstruct the beam for etch angles covering the entire range of 0° to 90°. Since the etching is done over a sweep angle that is centered about 0°, 90°, 180° and 270°, the actual range of usable angles will range from 0° to less than 90°. The upper bound for the main etch angle is set by the chosen sweep angle.

In ion beam etching, faceting of the mask in which the vertical sidewall of the mask gradually converts to a tapered sidewall is a serious limitation. The facet formation is initiated at corners since the sputter rate for many materials is maximum for an etch angle between 0° and 90°. For a pillar, the mask erosion accelerates once the faceting fronts merge at the top of the pillar resulting in rapid mask loss and shrinking of the pillar diameter. Facet formation can be slowed down by etching at an optimal angle between 0° and 90°. Thus it is advantageous to use larger etch angles to minimize faceting and maintain mask integrity through the etch.

The main etch and redeposition removal steps can also be performed in multiple steps each one at a different angle and in a continuous or windowed mode. For example, the overall height of the pillars typically decreases as the etching proceeds since the mask erodes faster than the increase in the etch depth. Thus progressively larger etch angles can be used as the etching proceeds. Similarly a windowed mode with a narrow sweep angle may be used in the beginning, with progressively increasing sweep angles as the overall height of the pillars decreases, and eventually continuous mode as the sweep angle covers a ±45° quadrant. It has been experimentally observed that etch angles between 25° and 45° for the main etch result in etched structures with more vertical sidewalls. The higher the beam energy, the lower the optimal angle. While these larger angles may not be feasible at the start of the etch, larger etch angles are possible as the etching proceeds.

In some implementations, use of the larger etch angles may result in the formation of a foot at the base of the structure. To compensate for this foot, after the main etch has been completed, a foot removal step at low etch angles may be inserted to selectively remove or trim the foot, without degrading the sidewall angle of the structure.

Also in some implementations, the clean-up etch is at a larger angle to remove any redeposited material along the sidewall that extends from just below the MTJ (e.g., about 10 nm, or more, or less (e.g., 2 nm or less)) to just above the MTJ (e.g., about 10 nm, or more, or less (e.g., 2 nm or less)). This clean-up etch can be performed in a range of angles centered about a rotation angle of 45°, 135°, 225° and 315° at incidence angle arc tan (d/h), (where "d" is the distance between pillars, and "h" is the depth of the feature) to provide a preferential etch on the wall of the feature, while the bottom remains almost intact due to ion beam shadow by the wall.

Further in some implementations, the clean-up is performed in a range of angles approximately 30-50 degree that is centered around angles of 45°, 135°, 225° and 315° by providing sweep in said range of the angles.

Optionally additionally, the encapsulation coating is hydrogenated diamond-like carbon deposited by a directional collimated large area ion beam extracted from a gridded ion beam source using a hydrocarbon based plasma.

In some implementations, RIE is used to remove the remainder of the stack, after encapsulation layer formation, stopping just past the bottom of the stack. The RIE can be performed by a directional collimated large area ion beam extracted from a gridded ion beam source using a halocarbon based plasma (RIBE).

In some implementations, the magnetic stack patterning on the wafer uses collimated large area gridded ion beam source; processing performed in the same vacuum chamber and includes sequential steps:

ion beam etch using a near-normal low energy ion beam etch from inert gas plasma stopping just past the magnetic tunnel junction;

clean-up ion beam etch from inert gas plasma at a larger angle to remove any redeposited material along the sidewall that extends from just below the MTJ to just above the MTJ;

encapsulation over the etched stack by ion beam deposition of hydrogenated DLC from hydrocarbon based plasma;

etch the remainder of the stack stopping just past the bottom of the stack using a near-normal low energy (<200 V) by RIBE;

perform an IBE clean-up etch at a larger angle;

deposit a DLC encapsulation over the etched stack.

Example post-processing steps include:

the wafer removal; and the source recovery by Ar/Ar—$O_2$ plasma and ion beam extraction.

In some implementations, the apparatus for the magnetic stack patterning includes a vacuum chamber, wafer loader, a wafer fixture, and an RF ion beam source with gridded optics. The apparatus may have a hidden anode to provide electrons removal during ions extraction, and/or supply for grids cleaning. The apparatus may also contain a source to generate a neutral beam of oxygen for controlled oxidation of trace amounts of redeposited material and/or to repair damage to the MgO tunnel barrier in the MTJ.

In the following description, reference is made to the accompanying drawing that forms a part hereof and in which are shown by way of illustration at least one specific implementation. The following description provides additional specific implementations. It is to be understood that other implementations are contemplated and may be made without departing from the scope or spirit of the present disclosure. The following detailed description, therefore, is not to be taken in a limiting sense. While the present disclosure is not so limited, an appreciation of various aspects of the disclosure will be gained through a discussion of the examples provided below.

FIG. 1 illustrates an STT-RAM structure or stack 100 prior to being etched using a hard mask (HM) pattern. A first ferromagnetic (free) layer/barrier/second ferromagnetic (reference) layer 102/103/104 (identified as CoFeB/MgO/CoFeB layers) form a magnetic tunnel junction (MTJ) 101 which is the most electrically sensitive portion of the stack 100. Below the MTJ 101 is a ferromagnetic pinning layer 106 (identified as CoPt layer) on a spacer (Ru) layer 107 which itself is over a barrier layer 108 (identified as TaN layer). Above the MTJ 101 are a barrier layer 109 (identified as Ta layer) and top electrode 110 (identified as Ru), with a hard mask (HM) 112 on top. The stack 100 is typically built on a wafer 115, e.g., a Si wafer with a $SiO_2$ layer. Typical dimensions for the various layers are shown in FIG. 1, with the exception of the HM 112 which is, approximately 100 nm.

Any etch-induced magnetic damage or redeposition of conductive materials on the exposed sidewall of the MTJ portion 101 of the stack 100 can degrade device performance.

Figure 2:
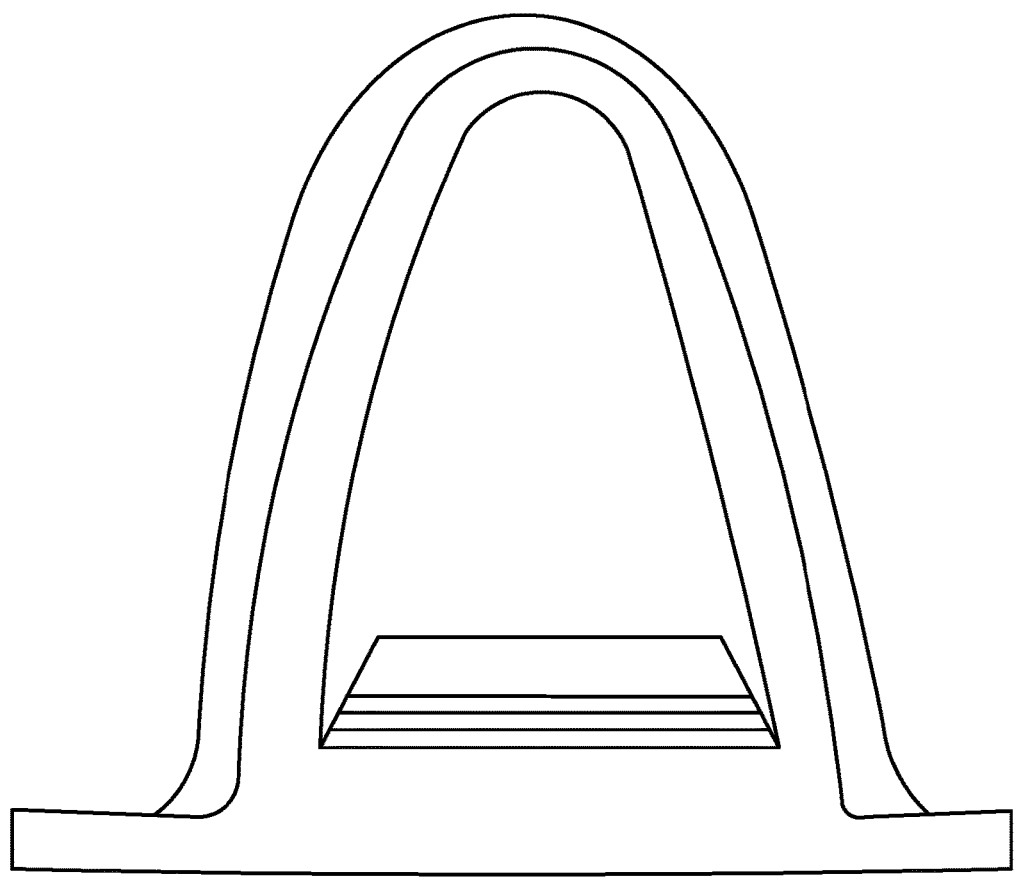
FIG. 2 is a schematic cross-sectional side view of an example STT-RAM structure after having been etched.

FIG. 2 provides an STT-RAM stack after having been etched.

To understand how etching conditions influence the etching rate and redeposition on the various surfaces of the STT-RAM stack, particularly the MTJ, a 2-dimensional (2D) ion beam etching model was created. While a 3-dimensional (3D) model is best to capture all the effects and more closely predict the actual experimental results, the primary effects can be captured by a 2D model that considers etching of a line space pattern rather than a pillar pattern. Various elements of the 2D model are described below to provide context for the simulation results.

Figure 3:
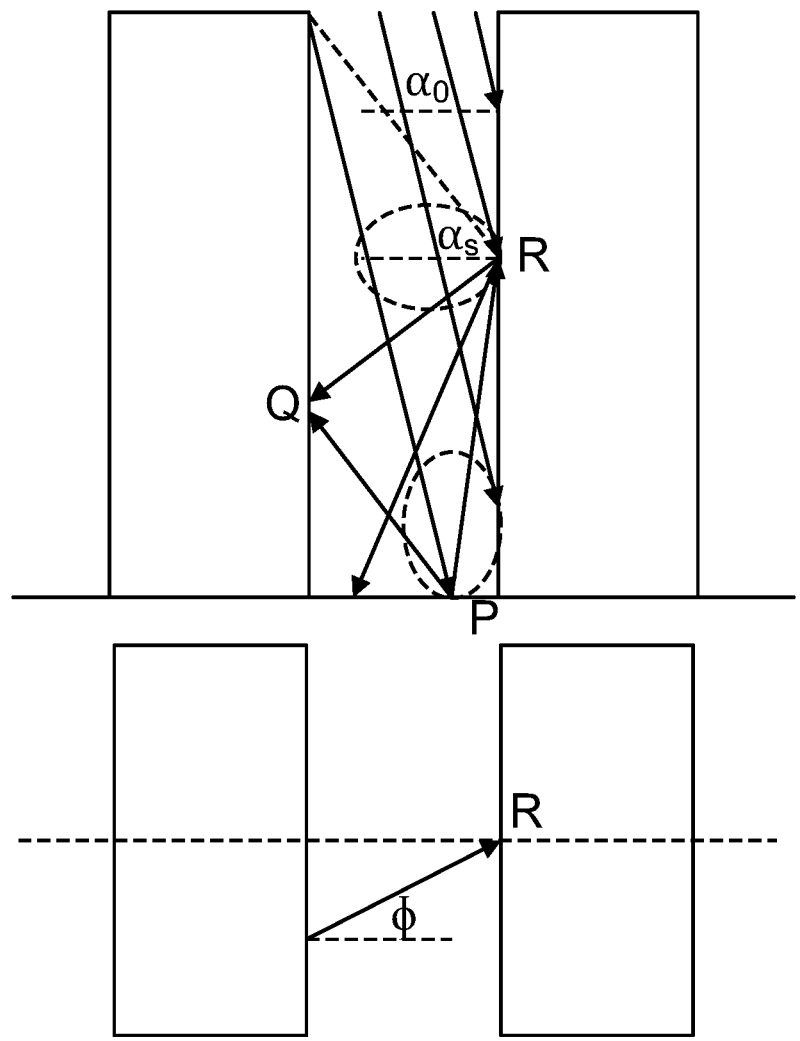
FIG. 3 is a schematic of a 2-dimensional ion beam etching model for a line/space feature.

The feature being etched is a line/space pattern having a line-width of 50 nm, space-width of 50 nm or 400 nm, and a height (distance from top of feature to base of feature) of 65 nm. The structure is etched at various angles (≥10°), where the angle is measured between the beam and the normal to the wafer surface. The etch model includes an angle dependent etch rate. The etch flux is emitted in a plume and sticks to any surface it encounters resulting in redeposition on the surface. This effect is illustrated in FIG. 3. Points (P, Q, R) on the surface are etched when $\alpha_s \leq \alpha_0$. The sidewall is etched for half a revolution, since it is shadowed by the feature during the other half of the revolution. The etched material redeposits on facing surfaces. Thus material etched at Point P redeposits at Point Q and Point R. Likewise, material etched at Point R redeposits at Point P and Point Q. The implication is that etching of one surface results in redeposition of the etched material on any surface that intersects the path of the etched material trajectory.

Figure 4:
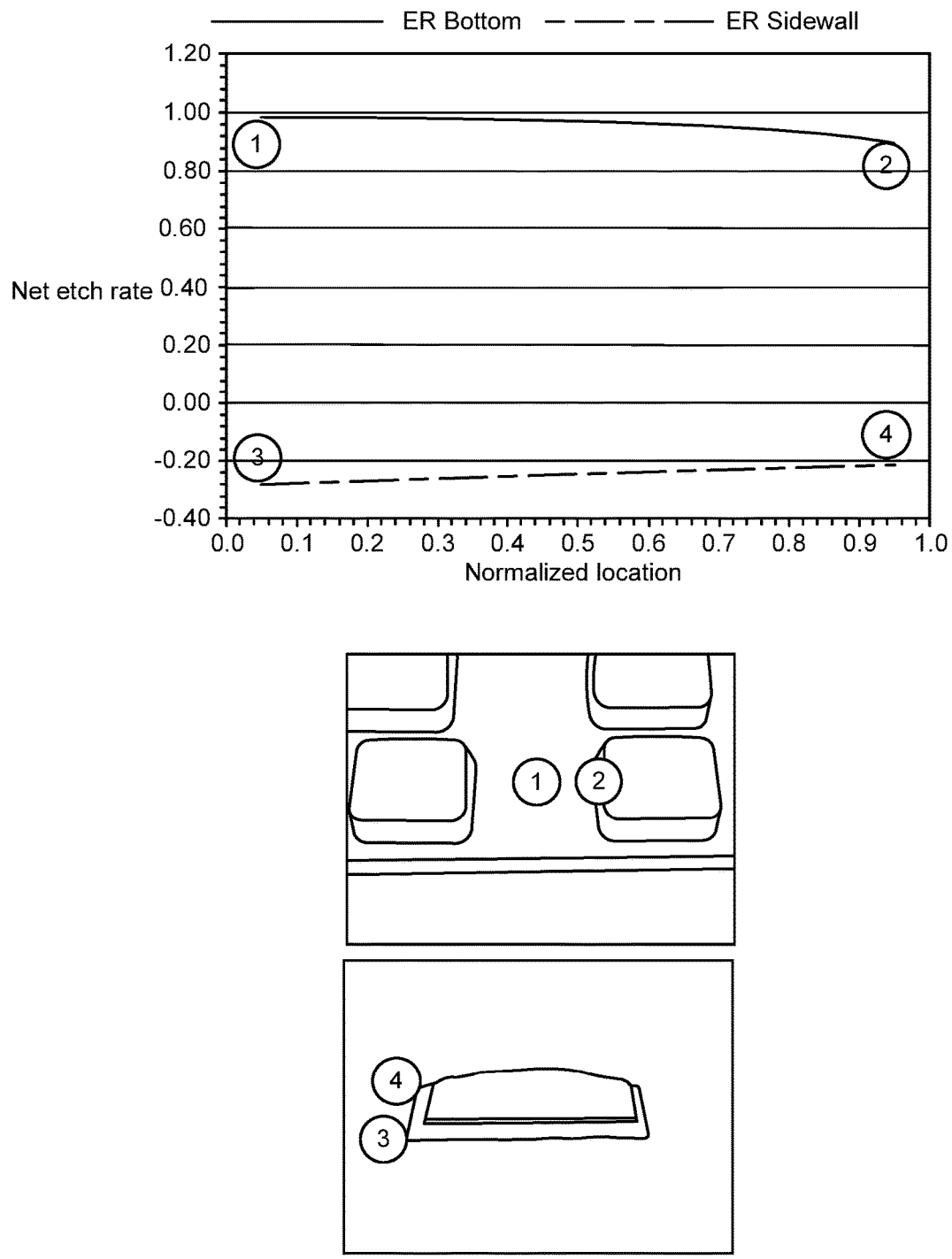
FIG. 4 shows graphical results and perspective views of isolated etched STT-RAM structures.

Actual results for etching of isolated features are shown in FIG. 4. These figures show that for a 10° etch angle, net redeposition on the sidewalls is ~25% of the etch depth along the bottom of the feature. While the etch rate along the bottom is fairly uniform, the etch rate along the entire sidewall is negative signifying that the redeposition rate on the sidewall exceeds the etching rate on the sidewall. The simulation results are supported by the actual observed amount of redeposition.

Figure 5:
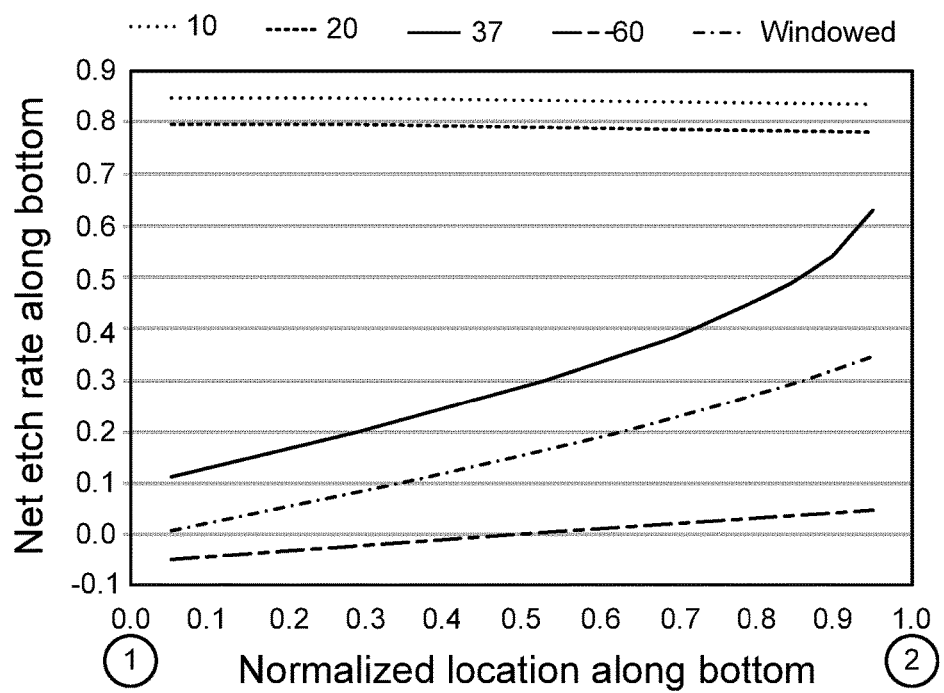
FIG. 5 shows graphical results for the isolated etched STT-RAM structures shown in FIG. 4.
Figure 5:
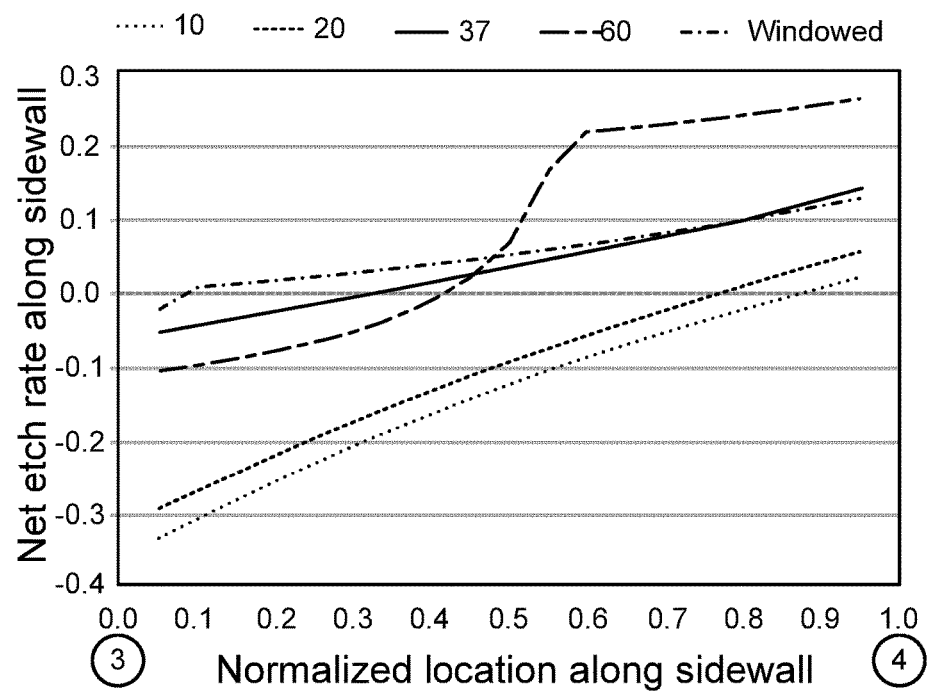

The ion beam etching of the equal line/space pattern is shown in FIG. 5, where the notations 1, 2, 3 and 4 refer to the locations referenced in FIG. 4. The etch rate along the bottom of the structure is fairly uniform at etch angles of 10° and 20°, but is extremely non-uniform for angles of 37° and 60°. At these larger etch angles, the bottom of the feature is shadowed for a portion of the rotation. The location 1 is shadowed for a smaller fraction of the wafer rotation compared to location 2, which results in a higher etch rate at location 1 compared to location 2.

The etch rate along the sidewall, e.g., at location 3, is always negative signifying a net redeposition. Additionally, the etch rate along the majority of the sidewall is negative, except close to location 4. As the etch angle is increased (from 10° to 20° to 37° and 60°) the upper location of the net redeposition region moves away from location 4 and terminates closer to location 3. However, for all etch angles, the redeposition region extends from 0 (bottom corner of sidewall) to ~30% of the total height. Thus, there is no etching condition that avoids redeposition along at least a portion of the sidewall.

Figure 6:
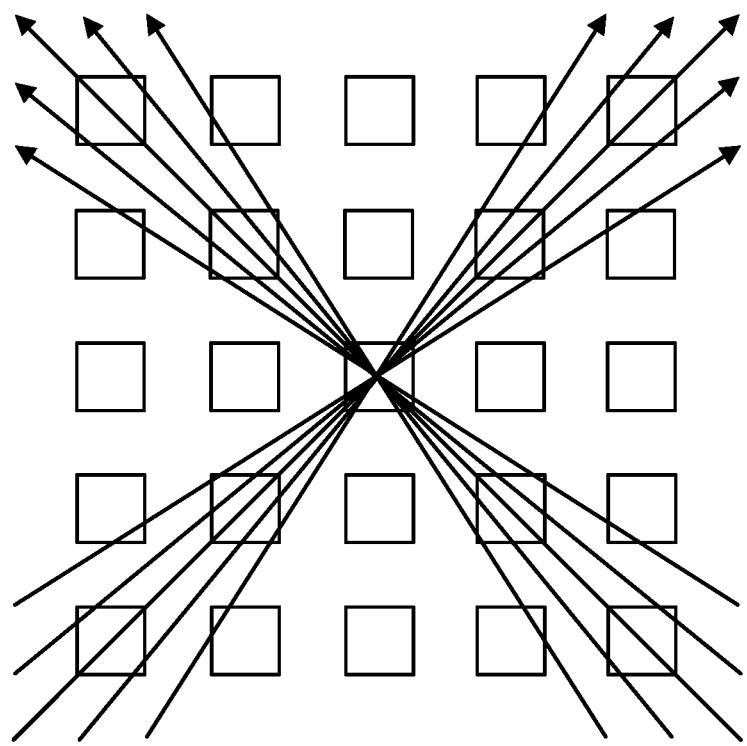
FIG. 6 is a schematic representation of a square pattern of STT-RAM structures showing windowed etching mode illustrating various angles over which the STT-RAM structures can be etched.

To avoid redeposition along the majority of the sidewall, except in the vicinity of the bottom corner (location 3), a windowed etching mode is used. By use of the term "windowed", what is meant is that the etch is done in selected areas or quadrants (window) rather than over (around) the entire structure; in a windowed etch, there is at least one area or region in one rotation that is either not etched or etched to a lesser amount. FIG. 6 shows a windowed etching mode showing the range of angles over which the wafer is etched centered about a rotation angle of 45° (e.g., within about ±20° of 45°—e.g., about 25° to about 65°), where the 45° is relative to a reference orientation of 0°, which is well known in the field as the direction of rows of the structures. The windowed etching mode is repeated for rotation angles of 135°, 225° and 315°, relative to the reference orientation of 0°, thus providing a four quadrant windowed etch. In this mode, the etch beam is only turned on during a portion of the rotation centered about the angles 45°, 135°, 225° and 315°, and the etch angle is chosen so that the beam reaches location 3 during the entire period the beam is on, while it reaches location 1 for only a very short period while the beam is on. In this manner, the redeposition along the sidewall is removed, and a very small net positive etch rate is maintained along the entire bottom of the feature extending from locations 1 to 2.

The same effect can be achieved by modifying the rotation speed continually so that the wafer sweeps slowly (e.g., 1-10 rpm) for a range of rotation angles centered about (e.g., within about 20° of) 45°, 135°, 225° and 315° and rotates very fast (e.g., 10-100 rpm) for rotation angles that are in between. In such a method, the beam is kept on during the entire rotation, but the etched amount for rotation angles that are in between is very small because of the very short dwell time of the beam on the wafer during the fast rotation phases.

The simplest implementation of the windowed etch is to etch at near normal incidence (e.g., 10° or less) to etch the feature to the desired depth, and then remove the redeposited material along the majority of the sidewall via a windowed etch at a larger etch angle (e.g., about 37°, or more). The magnitude of the sweep angle centered about 45°, 135°, 225° and 315° is chosen so that a net etching rate is maintained along the floor of the pattern while removing the redeposition from the sidewall. Despite the windowed mode of etching, redeposition at the base of the feature may not be entirely avoided. Thus, an over-etch into the underlying layer (e.g., $SiO_2$) may be needed so that the sidewalls of the active portion of the STT-RAM stack are free of redeposition.

A consequence of the windowed etch is that the sidewall of the feature etches at a faster rate at the top of the feature as compared to the base of the feature (see, FIG. 5). This results in tapering of the sidewall profile, which is undesired as the feature sizes are scaled down to sub 30 nm. To alleviate this effect, an encapsulation of an etch stop material, such as ion beam deposited diamond-like carbon (IBD DLC), can be directionally deposited along the top portion of the sidewall and to protect the magnetic tunnel junction (MTJ). This step is performed after the stack has been etched past the MTJ and the redeposited material has been removed with a windowed etch. During the subsequent windowed etch after the full stack has been etched, the top portion of the sidewall will be etched, albeit at a slower rate due to the presence of the etch stop encapsulation. An optimal beam energy may be used during the windowed etch to keep the sidewalls vertical despite the larger etch angles. Note, as mentioned before, the optimal beam energy to obtain a vertical sidewall decreases as the etch angle is increased.

To avoid a thick build-up of redeposition that can form filaments and debris, the near normal incidence etch (e.g., no more than about 10° from normal) may be alternated with a windowed etch periodically. In the extreme limit, the etching may switch continually between the low angle etch and the windowed etch via synchronization of the wafer rotation and wafer tilt mechanisms. In this type of orbital mode etching, the wafer tilt is continually changed between the low angle and high angle settings using a programmed profile, while the wafer rotation is changed between full wafer rotations at the small etch angle and windowed operation at the larger etch angle.

A portion of the near-normal etch or the windowed etch may be performed with an oxidizing beam to convert any residual redeposition that is not removed into an insulating oxide. This may be performed at even lower energy (e.g., 50 V) to avoid oxidation of the STT-RAM stack. Alternatively, a neutral beam of oxygen may be used to oxidize the surface via natural oxidation. This process can also be used to oxidize the near surface region of the pillar so that any metal(s) that may be present in the MgO tunnel barrier layer (e.g., due to inter-mixing induced by the ion beam during the etching process) are also oxidized.

To avoid etch-induced damage or shorting of the MTJ and enable scaling down to, e.g., 20 nm wide structures, the etching sequence illustrated in FIGS. 7A through 7I is proposed. In general, the dimensions for the MTJ of FIGS. 7A through 7I are the same as or similar to the dimensions of the MTJ of FIG. 1.

Figure 7A:
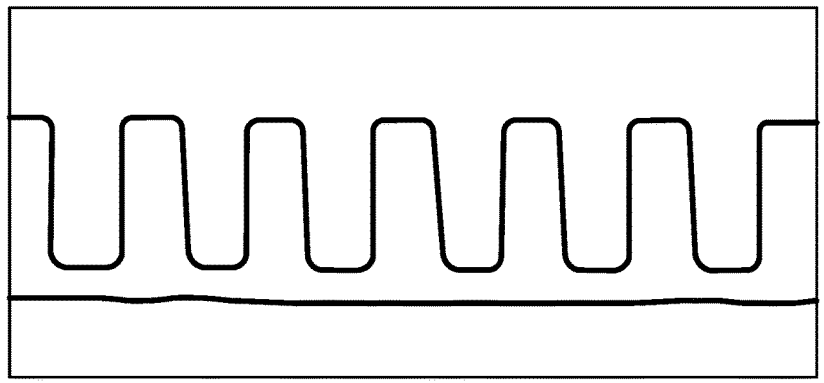
FIGS. 7A through 7I are schematic side views, illustrating, stepwise, an example method of etching an STT-RAM structure.

FIG. 7A shows a wafer having a plurality of etched STT-RAM structures, etched just past the MTJ (101). The structures were etched using a near-normal low energy ion beam etch, stopping just past (below) the magnetic tunnel junction. This methodology (1) minimizes critical dimension (CD) loss, (2) maintains near vertical profile angle, and (3) the low energy etch (100 V) minimizes sidewall damage.

Figure 7B:
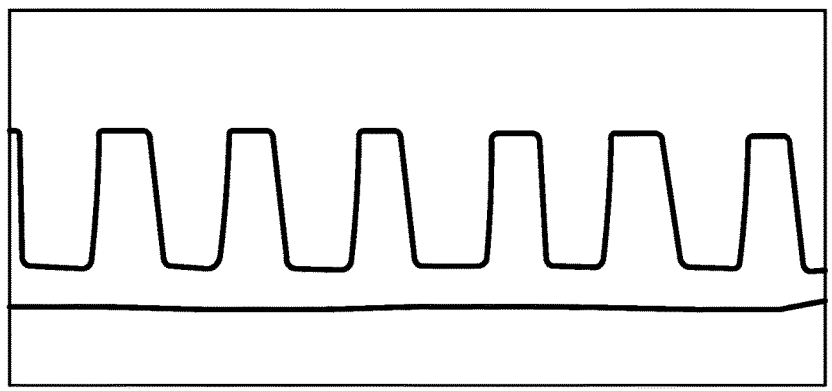

FIG. 7B shows the etched structures (etched to the MTJ) subsequently cleaned up with a windowed etch at a larger angle to remove any redeposited material from the sidewall that may be present from just below the MTJ to just above the MTJ. This (1) prevents shorting of the MTJ, (2) minimizes CD loss and profile tapering (although tapering at the foot of the structure may be inevitable), and (3) terminates with an oxidizing low energy beam (e.g., 50 V) to convert any residual redeposition to an insulating oxide.

Figure 7C:
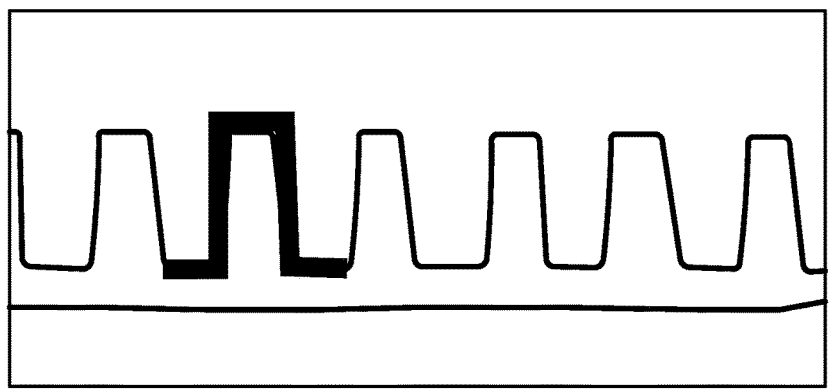

FIG. 7C shows the structures after a thin electrically insulating etch stop (e.g., DLC) has been applied; the etch stop is illustrated as the thick structure, although it is noted that the actual etch stop will not have such a thickness, and that the etch stop is present on all the pillars. The etch stop can be applied, e.g., using IBD, PVD, conformal PVD, or PECVD. The insulating etch stop (1) protects the sidewall of the MTJ from damage during the subsequent full-stack etch, (2) inhibits or prevents accumulation of conducting residue directly on the sidewall of the MTJ to avoid shorting, (3) helps recover the CD loss and makes the sidewall vertical or slightly re-entrant, (4) vertical/re-entrant sidewall reduces etching of etch stop over the sidewall of MTJ during the subsequent full-stack etch, and (5) the etch stop reduces sidewall etch during the full stack etch and subsequent windowed clean-up etch.

Figure 7D:
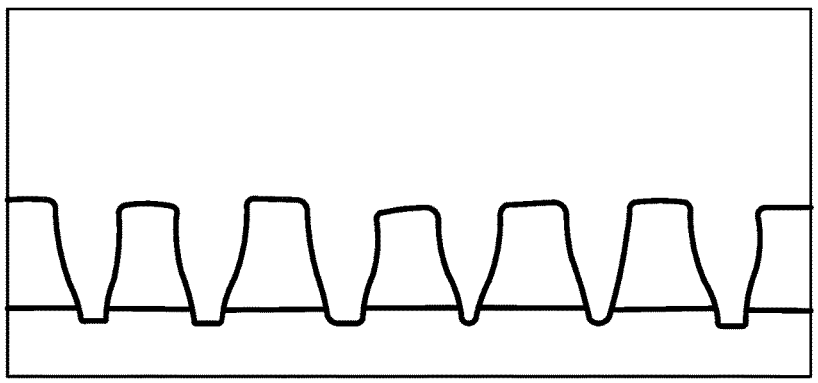

FIG. 7D shows the etched structures after the remainder of the stack is etched, stopping just past the bottom of the stack (near the 108 to 115 interface but within the 115 layer), using a near-normal low energy (<200 V) ion beam etch. This etching step, stopping just past the bottom of the stack and using a near-normal low energy ion beam etch, (1) minimizes etching of the encapsulation along the sidewall of the MTJ so that it is at least partially and mostly preserved (e.g., at least 75% is preserved, or at least 85% is preserved), (2) minimizes critical dimension (CD) loss, and (3) maintains near vertical profile angle. Additionally, a slightly higher energy etch increases etch rate and also minimizes beam divergence to maintain a near vertical profile angle.

Figure 7E:
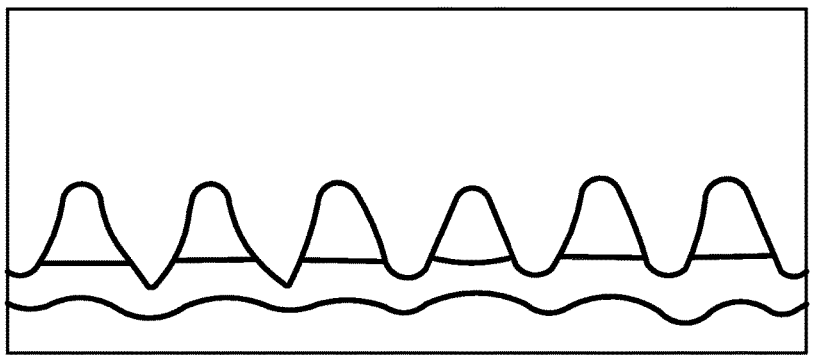

FIG. 7E shows the structures after a windowed clean-up etch done at a larger angle. This clean-up etch removes the majority of the redeposited materials from the sidewalls. Since the MTJ sidewall is protected by the encapsulation, some residue/redeposited material is acceptable. After the clean-up etch, an oxidizing low energy beam (e.g., 50 V) can be used to convert any residual redeposition to an insulating oxide.

Figure 7F:
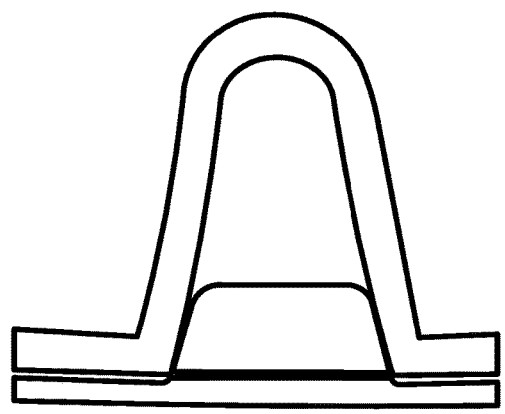

FIG. 7F shows a structure after having an encapsulation layer (e.g., $SiO_2$ or $Al_2O_3$) deposited over the etched stack. Such an electrically insulating layer (or, in some embodiments a dielectric layer) inhibits corrosion of the stack upon air exposure or during subsequent processing, and inhibits chemical damage of the stack during the deposition of the encapsulation. The encapsulation layer can be, e.g., 10 nm-20 nm thick.

A variant of the process sequence described in FIG. 7A to FIG. 7F can be done to further reduce conductive material redeposition in the area of the MTJ, and to maintain near vertical walls of the structure. These steps are: clean-up step; first encapsulation step; and etch of the remainder of stack step.

Figure 7G:
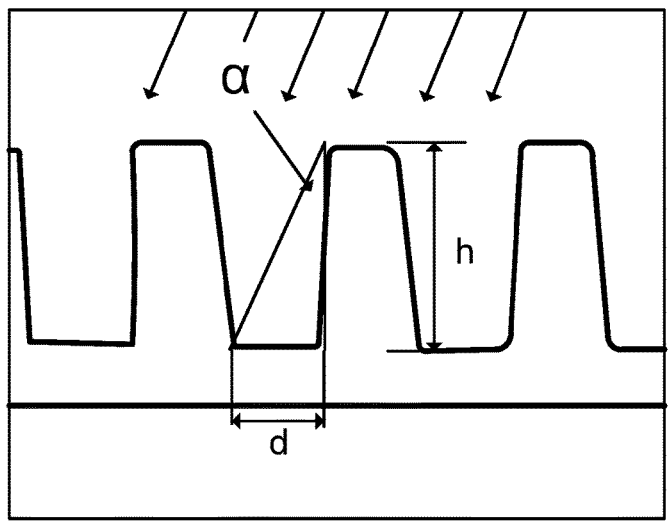

FIG. 7G shows the clean-up etch, at an incident angle arc tan (d/h) (where "h" is the depth of the etch step stopping just past the MTJ, "d" is the width between pillars or structures, and "α" is the ion beam incident angle") to provide preferential etch on the structure wall, while the bottom remains almost intact due to the ion beam being shadowed by the wall. This minimizes redeposition of material along the sidewall specifically in MTJ area. Additionally, it further reduces shunting of the magnetic junction. This may substitute or complement the windowed redeposition removal step shown in FIG. 7B.

Figure 7H:
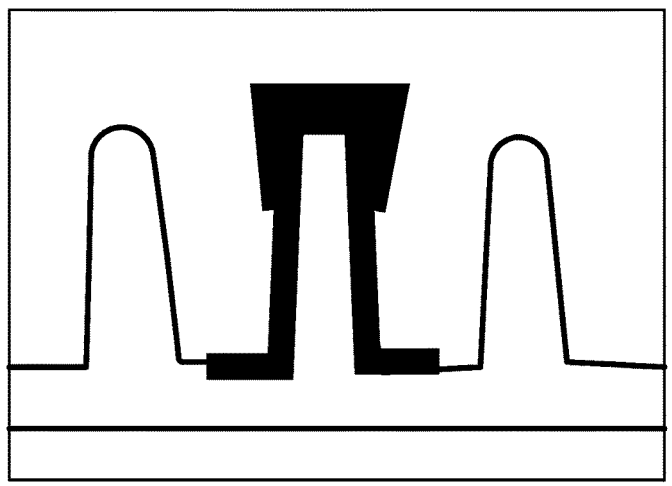

FIG. 7H, which replaces the step shown in FIG. 7C, illustrates an encapsulation coating on the structure, the coating having been deposited in two layers. Although the encapsulation layer is shown on only one structure in FIG. 7H, it should be understood that the layer would be present on all pillar structures. The first layer (shown in red) is a near-conformal or conformal insulating layer. The second layer (shown in blue) is a selectively deposited layer on a hard mask (HM) near the top of the structure. This second layer inhibits and/or prevents facet formation on the HM, and sustains near vertical walls of the structure. This deposition step can be performed by directional deposition methods such as PVD, or IBD. Selectively deposited material can be the same as the conformal layer, or material that has lower sputtering yield.

Figure 7I:
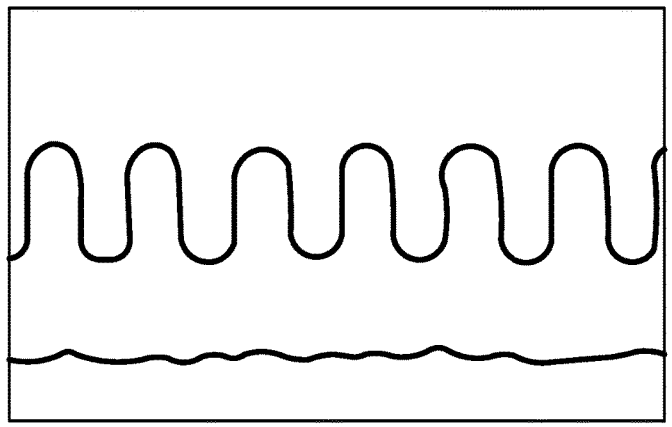

FIG. 7I shows structures having an encapsulation coating thereon. The encapsulation coating can be, e.g., hydrogenated diamond-like carbon (DLC) deposited by, e.g., directional collimated large area ion beam extracted from gridded ion beam source using hydrocarbon based plasma. The coating can be deposited uniformly on 3-D dense arrays over the whole wafer, and the CD (shape) can be controlled by beam incidence angle. It can also be an amorphous carbon, hydrogenated carbon, or carbon nitride film deposited via conformal PVD in which the tilt of the substrate relative to the PVD target is varied over a range of angles and a separate ion beam is optionally used to tailor the shape of the encapsulation.

An alternate methodology to remove the remainder of the stack (an alternate to the step shown in FIG. 7D or 7H) is to remove remainder of the stack after encapsulation layer formation stopping just past the bottom of the stack by a combination of IBE and RIE. Using RIE sustains near vertical walls formation through whole stack, and no shorts of MJT occur due to protection of the MTJ by the encapsulation layer. Reactive ion beam etching (RIE) can be performed by using a directional collimated large area ion beam extracted from gridded ion beam source using halocarbon based plasma (RIBE). RIBE can be used for variable incidence angle etches. RIBE allows to sustain the structure vertical walls, while minimizing the amount of non-volatile products by incidence angle selection (e.g., 10-20 degrees).

Summarized, this method of STT-RAM magnetic stack patterning on the wafer uses collimated large area gridded ion beam source. The processing can be performed in the same vacuum chamber as the deposition of the structure. A specific example process includes at least the following sequential steps:

ion beam etch using a near-normal low energy ion beam etch from inert gas plasma stopping just past the magnetic tunnel junction;

clean-up ion beam etch from inert gas plasma at a larger angle to remove any redeposited material along the sidewall that extends from just below the MTJ to just above the MTJ;

encapsulation coating over the etched stack by ion beam deposition of hydrogenated DLC from hydrocarbon based plasma;

etch the remainder of the stack stopping just past the bottom of the stack using a near-normal low energy (<200 V) by RIBE;

perform an IBE clean-up etch at a larger angle; and deposit a DLC encapsulation over the etched stack.

Example post-processing steps include:

the wafer removal; and source recovery by $Ar/Ar-O_2$ plasma and ion beam extraction.

Figure 8:
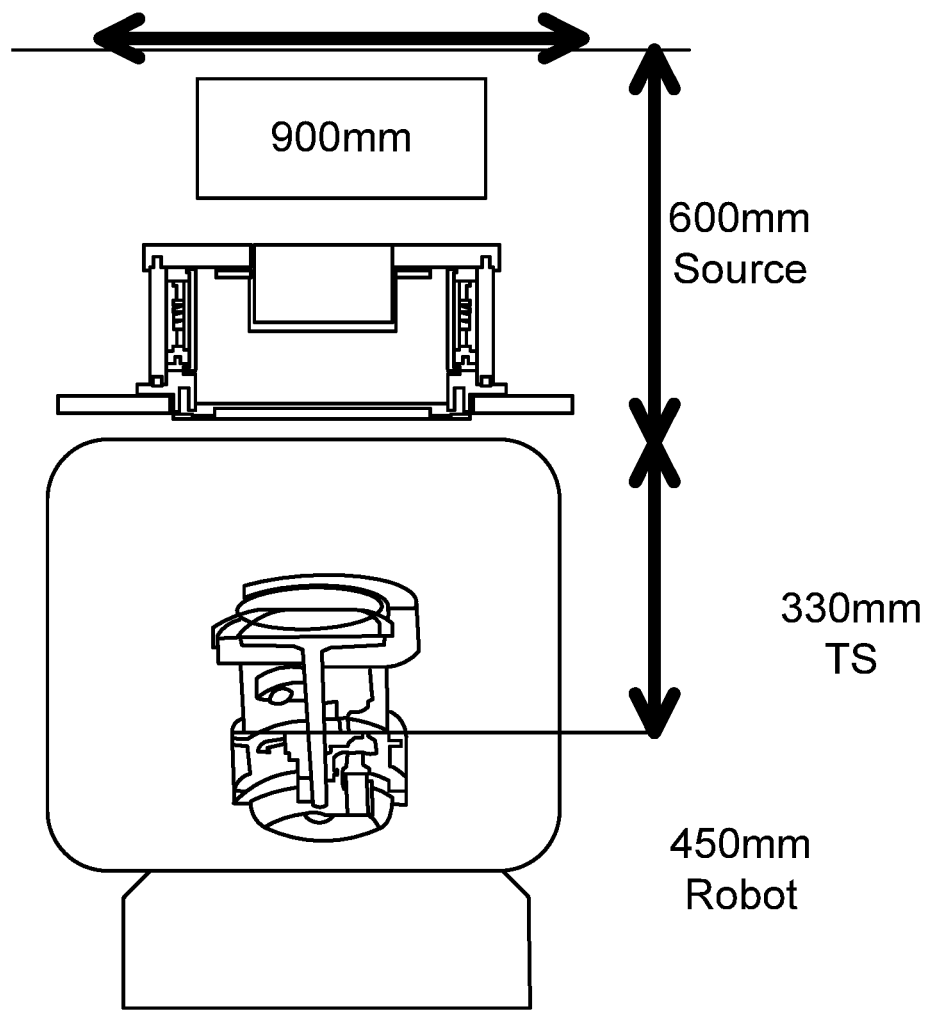
FIG. 8 is a schematic diagram of an example system for patterning (including deposition and etching) of a STT-RAM structure.

FIG. 8 shows an example apparatus for STT-RAM magnetic stack patterning. The apparatus includes a vacuum chamber, wafer loader, wafer fixture, an RF ion beam source with gridded optics, a hidden anode to provide electrons removal during ions extraction, and supply for grids cleaning Utilization of this apparatus of FIG. 8 will allow performing combined IBE, RIE, and DLC coating deposition with the same apparatus. An alternative is to use separate chambers for the etching and deposition steps but both chambers could be attached to the same wafer loader.

Figure 9:
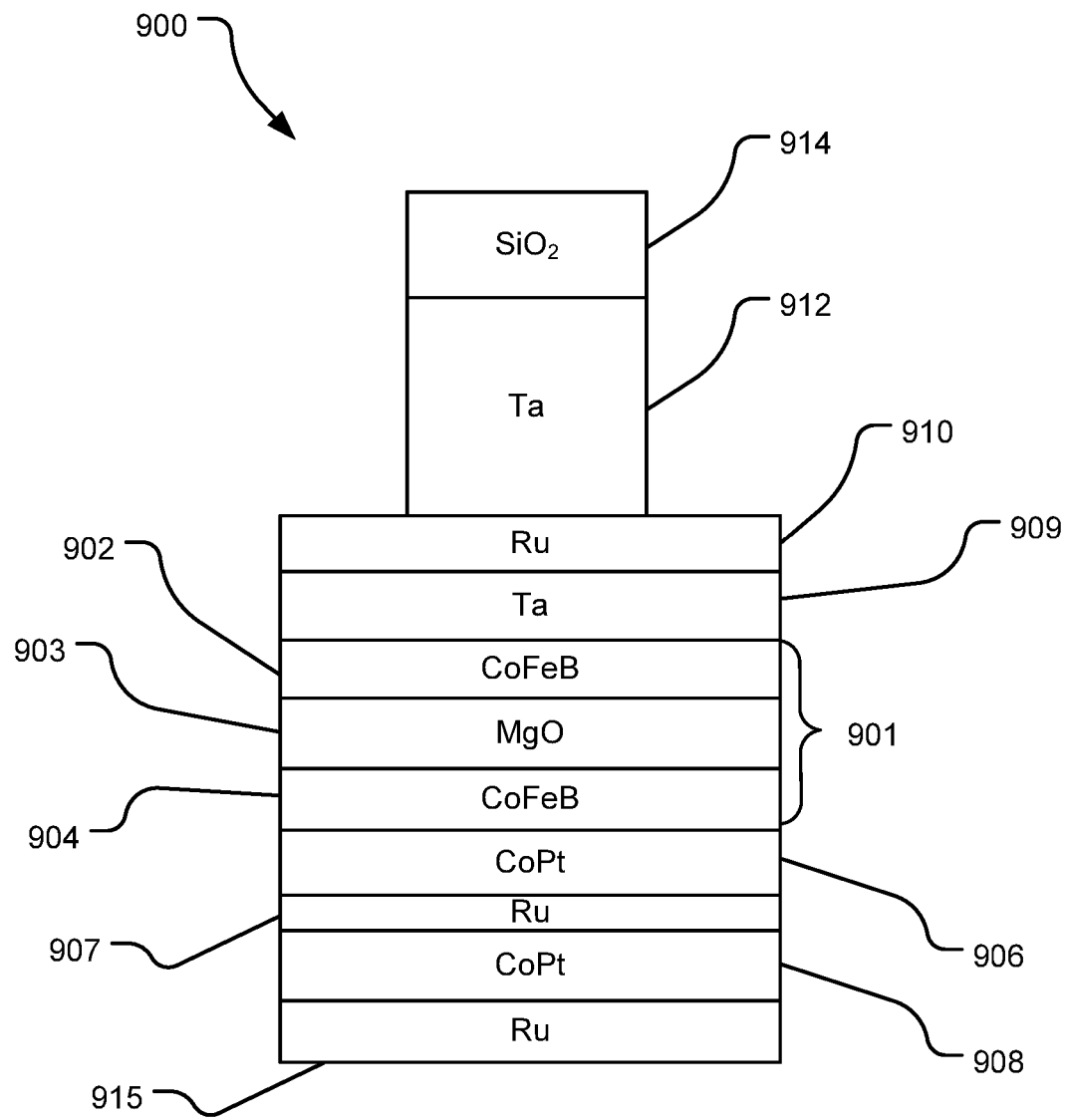
FIG. 9 is a schematic diagram of an example STT-RAM structure, having a MTJ stack.

Another scheme (method) of patterning an STT-RAM structure is proposed. An example structure of an STT-RAM device is shown in FIG. 9. Similar to the previous STT-RAM structure, structure or stack 900 in FIG. 9 has CoFeB/MgO/CoFeB layers 902/903/904 that form a magnetic tunnel junction (MTJ) 901 which is the most electrically sensitive portion of the stack 900. Stack 900 also includes a spacer (Ru) layer 907, a CoPt (pinned) layer 906 and a second CoPt layer 908. Above the MTJ 901 are Ta layer 909 and a Ru layer 910, with a Ta top electrode 912 and insulating $SiO_2$ layer 914 on top. This particular stack 900 is built on a Ru layer 915 overlying the substrate.

Typical IBE processes use argon (Ar) as the source gas for patterning structures. In IBE, Ar ions are accelerated towards a substrate to physical remove (sputter) the material of interest. The efficiency of removal is quantified by the sputter yield of different elements under ion bombardment. It is well known that the mass of incident ion has a significant impact on sputter yield. One measure of this is captured in an energy transfer ratio γ proposed by Walsh (Walsh et al., JVST B, 18, 3539 (2000)). Based on this qualitative formula, the ratio for different source gases with respect to the materials of interest in an STT-RAM structure can be estimated as $$\gamma = \frac{4M_1 M_2}{(M_1 + M_2)^2}$$

Figure 10:
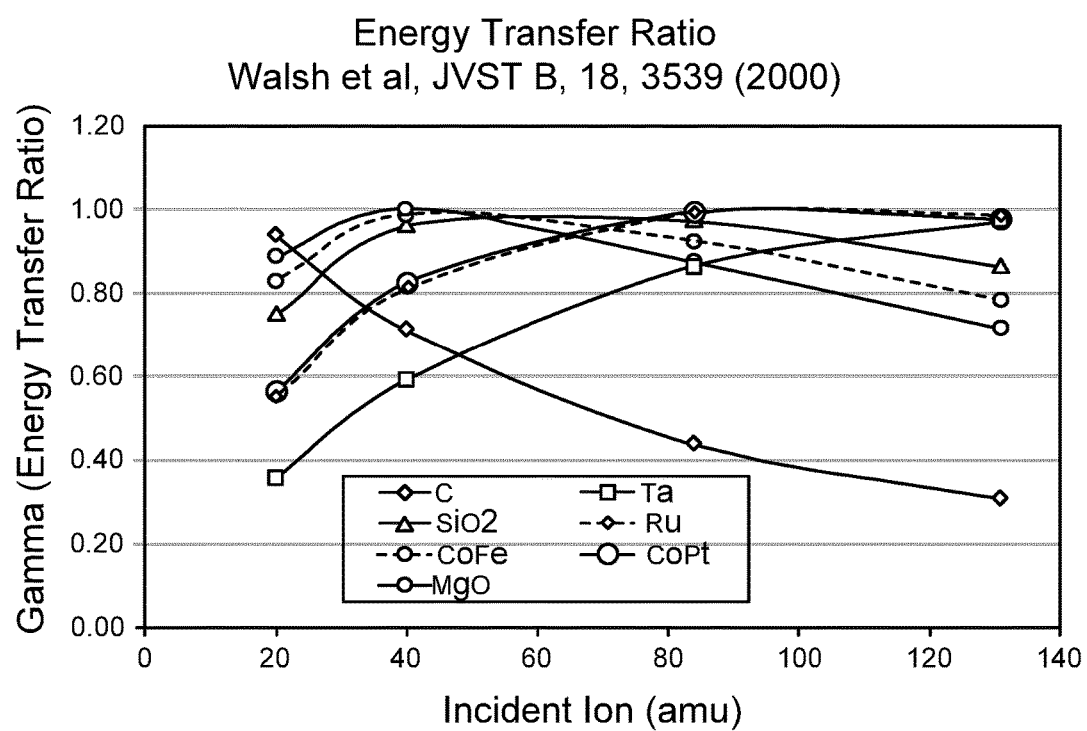
FIG. 10 is a graphical representation of energy transfer ratio as related to incident ion mass.

This ratio is provided in Table 1 below and also shown in FIG. 10.

TABLE 1

Mass Transfer Ratio of Incident Gas vs. Materials of Interest in STT-RAM Structures

| M1 mass | | 12 C | 181 Ta | M2 mass 60 $SiO_2$ | 101 Ru | 48 CoFeB | 97 CoPt | 40 MgO |
|---|---|---|---|---|---|---|---|---|
| Ne | 20 | 0.94 | 0.36 | 0.75 | 0.55 | 0.83 | 0.57 | 0.89 |
| Ar | 40 | 0.71 | 0.59 | 0.96 | 0.81 | 0.99 | 0.83 | 1.00 |
| Kr | 84 | 0.44 | 0.87 | 0.97 | 0.99 | 0.93 | 0.99 | 0.87 |
| Xe | 131 | 0.31 | 0.97 | 0.86 | 0.98 | 0.78 | 0.98 | 0.72 |

Assuming that the energy transfer ratio translates to sputter yield (and through that, into etch rates), a specific scheme of processing is proposed using gases other than argon. This scheme also includes using these other gases in combination with other gases (e.g., $O_2$) to address the challenges of redeposition that might cause the structure to short.

Figure 11:
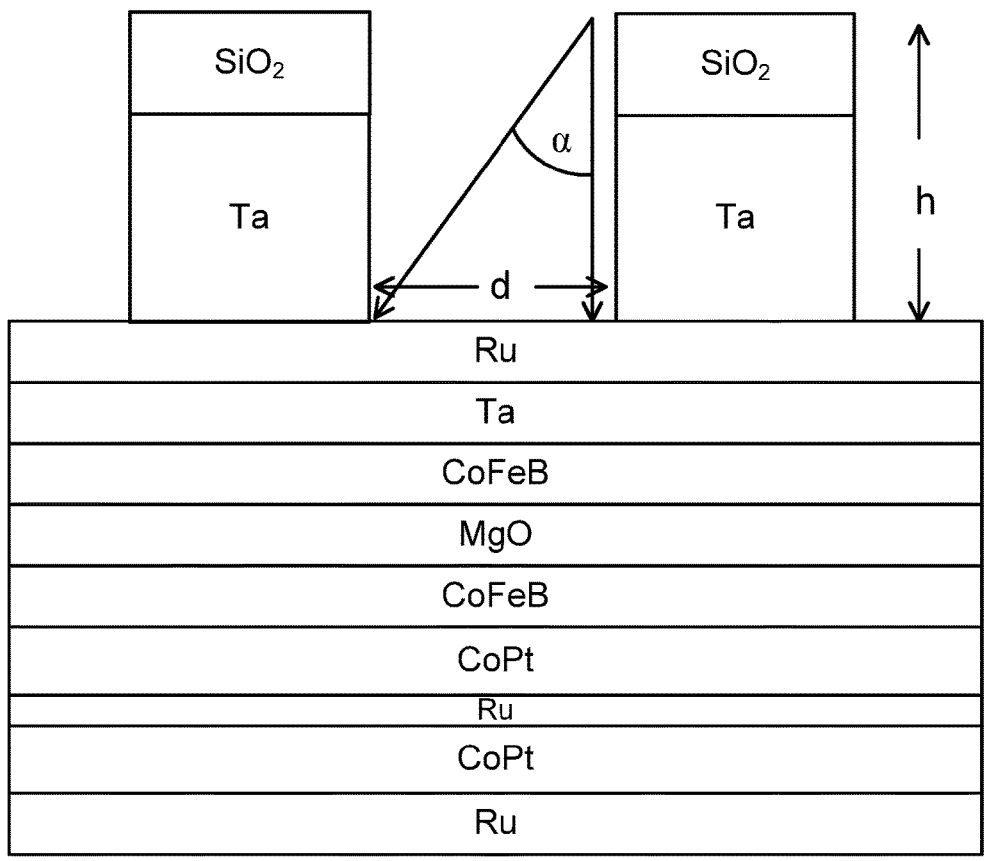
FIG. 11 is a schematic diagram of two example STT-RAM structures, showing angles of acceptance of incident ion beam.
Figure 12:
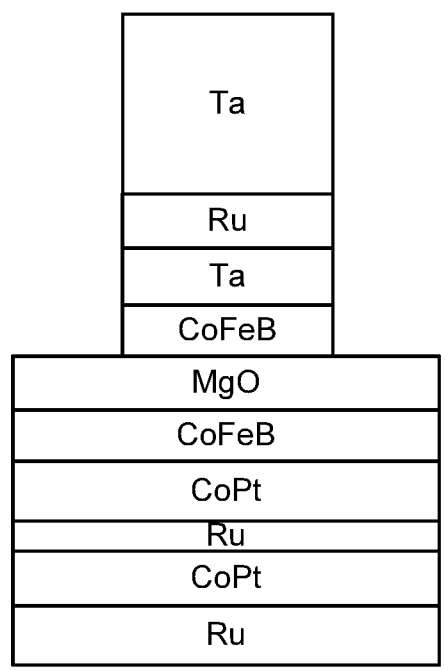
FIG. 12 is a schematic diagram of an example intermediate STT-RAM structure.

Step 1:

The angle of acceptance of an ion beam into the region where etching is necessary is defined by the aspect ratio of the mask height and the line and space dimension of the pattern (Pitch). See, FIG. 11. Neon gas (atomic mass 20) is used for etching the layers up to the beginning of MgO (e.g., the barrier layer 903 in FIG. 9), which is advantageous for the following reasons:

(1) Based on the energy transfer ratio calculations, one can extrapolate that the etch rate selectivity between $SiO_2$/Ru is approximately 2 and of $SiO_2$/Ta is 0.5 (the first two materials to be patterned);

(2) Assuming typical layer thickness (referring to FIG. 9) of 30-40 nm for $SiO_2$ hard mask 914, 90-100 nm for Ta electrode 912, 3-8 nm for Ru layer 910, and 3-8 nm for Ta layer 909, it is reasonable to expect to have removed all of $SiO_2$ layer 914 and a portion of the Ta layer 909;

(3) In a typical device, the $SiO_2$ layer 914 and Ta electrode 912 have total height "h", of which the $SiO_2$ layer 914 is approximately one third;

(4) At the end of this step, the resulting structure is shown in FIG. 12;

(5) This increases the acceptance angle by approximately 33%.

Step 2:

A desire of STT-RAM patterning is to avoid the shorting of the MTJ by the redeposited conductive material. In order to prevent the free-layer (CoFeB layer above the MgO barrier layer) from getting deposited with metallic layer, etch the MgO layer using a mixture of inert gas (e.g., neon, Ar, etc.) along with Oxygen. Using oxidizing gas allows the sidewall to be oxidized (in a self-limiting manner controlled by the time of MgO etch) thereby providing a non-conducting layer protection of the contact layers from post MgO etch. Additionally, the material that is being etched is MgO, which is non-conducting in itself, and sputtered material from this when it gets redeposited provides an encapsulation layer that protects the free-layer.

Figure 13:
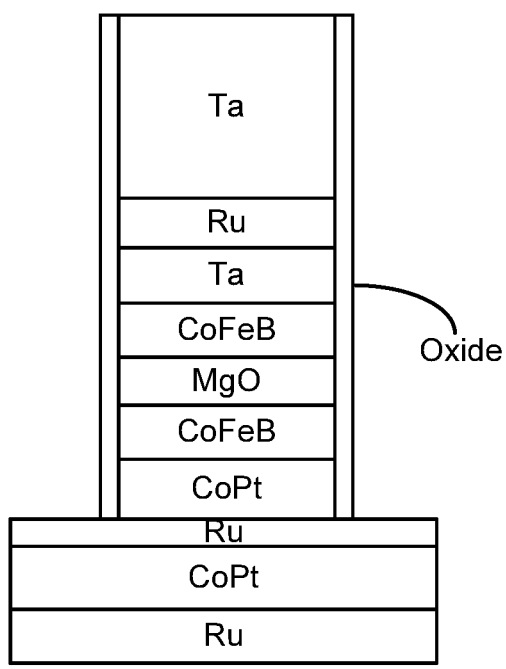
FIG. 13 is another schematic diagram of an example intermediate STT-RAM structure.

The resulting structure at the end of Step 2 is shown in FIG. 13.

Figure 14:
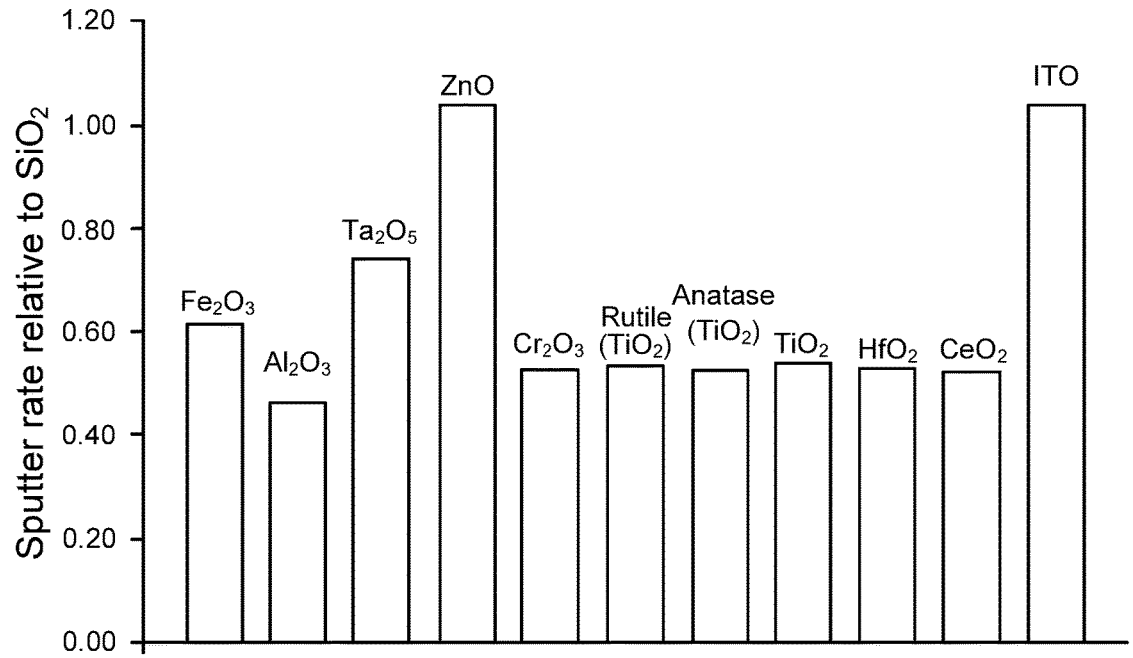
FIG. 14 is a graphical representation of metallic oxide sputter yields.

An additional benefit of this oxidizing etch is selective etch of the oxidized Ta hard mask, thereby giving the added advantage of controlling the subsequent ion beam acceptance angle (see FIG. 14, which provides a comparison of sputter yields of various metallic oxides normalized to $SiO_2$). A suitable combination of inert gas and oxidizing gas can allow a way to control the aspect ratio.

Low sputter yield of metals in STT-RAM stack beyond the barrier layer for Neon also allows for better control of oxidation of conductive metallic elements with low oxygen content.

Figure 15:
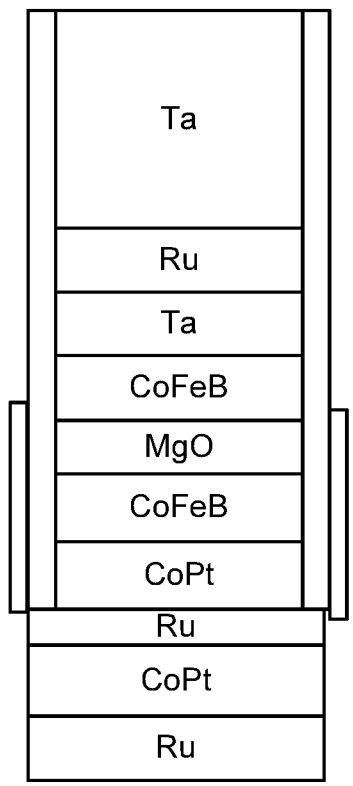
FIG. 15 is another schematic diagram of an example intermediate STT-RAM structure.

Step 3:

Further etch through the remainder of stack can be achieved using inert gas IBE. Any further conductive material redeposition on the sidewall is protected by oxidizing layers present from the previous step (Step 2). This protection is available all way up to the top electrode (i.e., the remaining Ta hard mask). A schematic of the structure after Step 3 is shown in FIG. 15.

A 3D simulation of the ion beam etching process was performed to understand how well experimental results could be predicted by modeling. For this simulation, an ion beam etching model that includes the following effects was used:

Structure consisted of a thick underlying dielectric (L0), a blanket barrier (L1=5 nm), a blanket device layer comprising the magnetic stack (L2=25 nm), a patterned top barrier (L3=5 nm), a top electrode layer (L4=145 nm) and mask layers. The pillar diameter, D=40 nm @ base of structure, 89° SWA (sidewall angle), P (pitch) =120 nm, resulting in a space of 80 nm between adjacent pillars Angle dependent etch rate Etched flux emitted in a plume Included redeposition with a sticking coefficient of unity Main etch angle was 10° to surface normal A 35° etch angle including windowed etch was used for post-etch redeposition removal Ion beam divergence=±2.5°

Beam synchronized with wafer rotation 20 nm etch into L0 for main etch

Over-etch using divergent beam for redeposition removal

Figure 16:
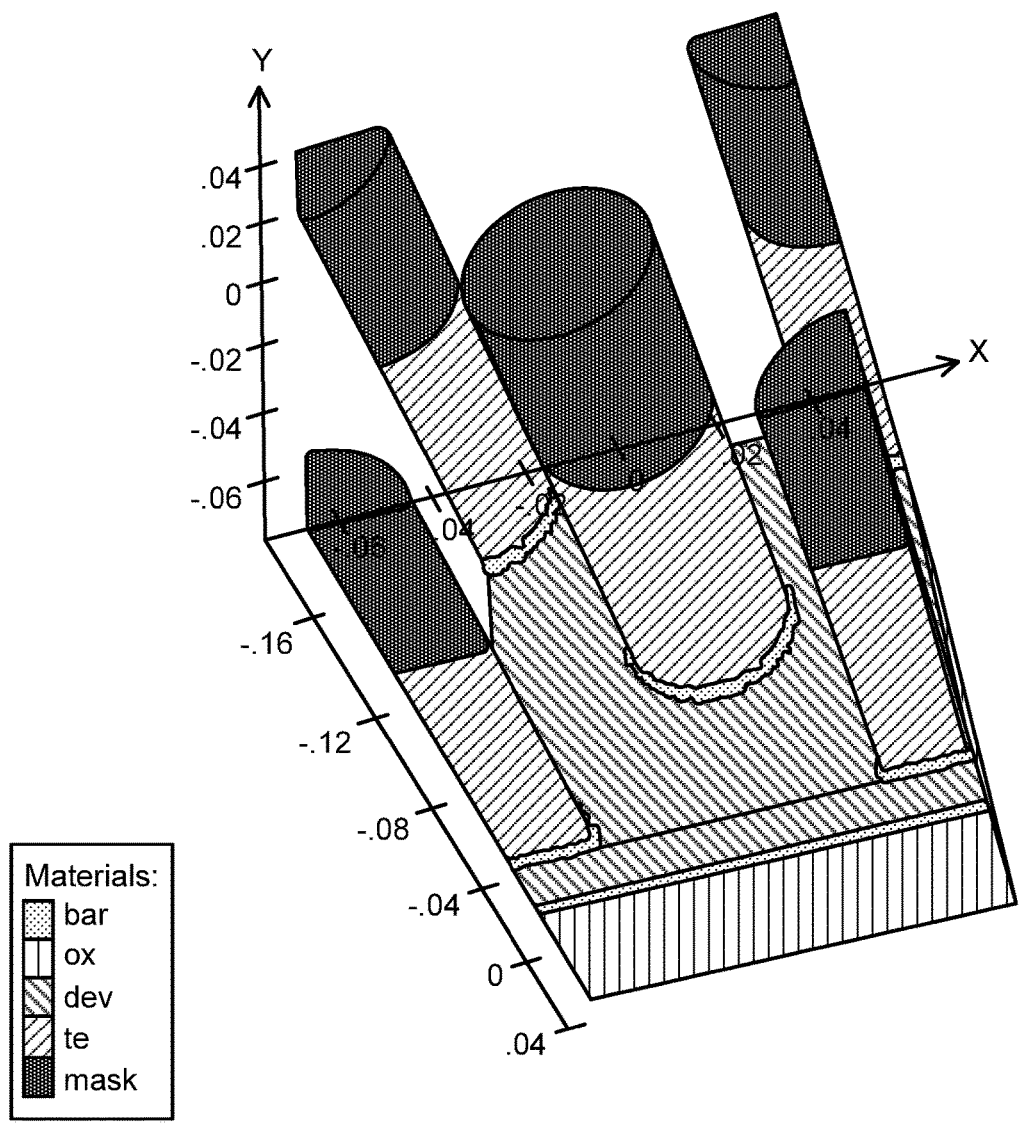
FIG. 16 is a graphical 3-dimensional representation of an STT-RAM structure before the main etch.
Figure 17:
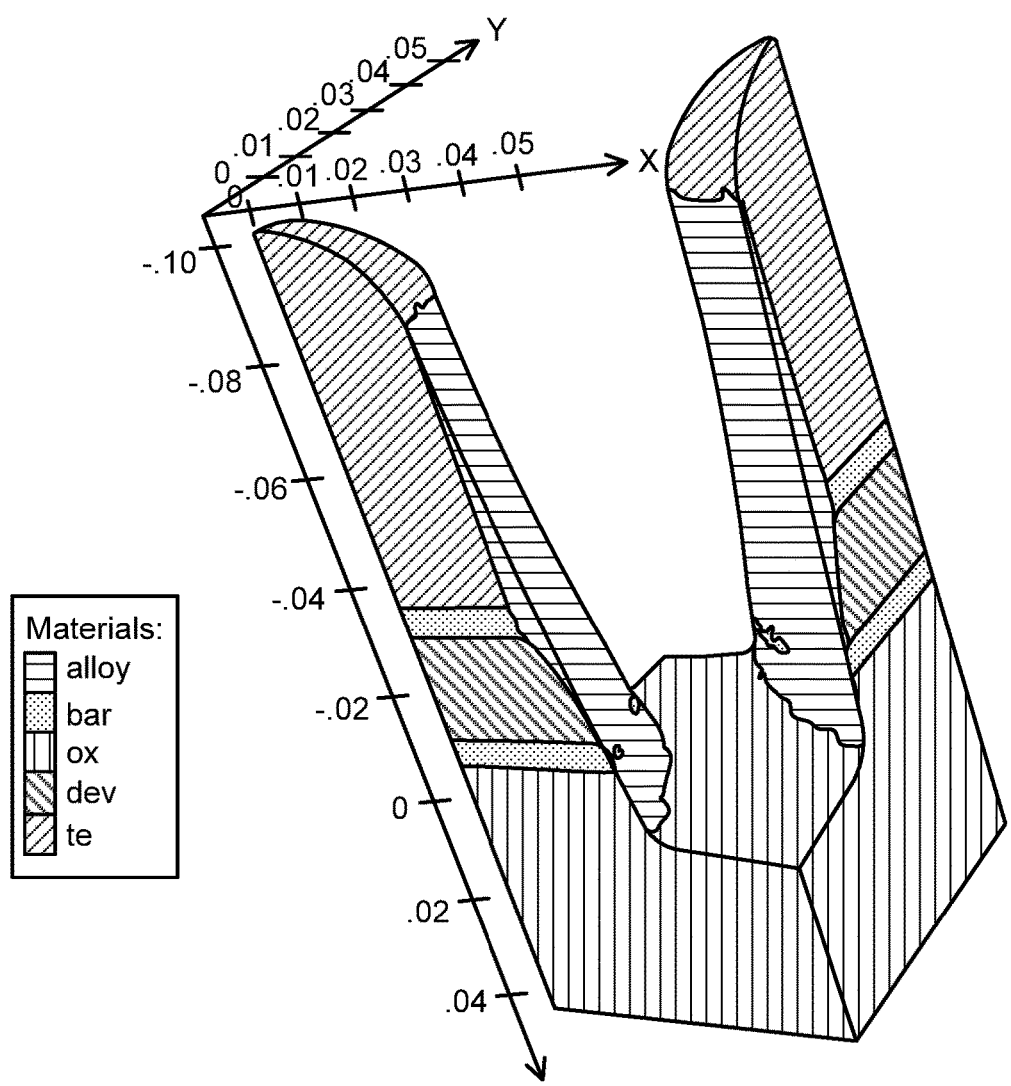
FIG. 17 is a graphical 3-dimensional representation of the STT-RAM structure of FIG. 16 after the main etch.

The results of the modeling are shown in FIGS. 16 and 17.

As expected, the main etch resulted in complete removal of the mask, redeposition along the sidewalls of the feature, and degradation in the sidewall angle. The redeposition over the magnetic stack gradually decreased as the etch progressed into the underlying dielectric. Thus, in order to reduce the redeposition, the etching should proceed well beyond the magnetic stack into the underlying material. The redeposition could also be reduced by increasing the ion energy and/or choosing the optimal etch angle. The former reduces the selectivity differences between the materials so that a shoulder is not formed at various interfaces. The shoulder increases the sidewall angle and allows redeposited material to accumulate over the shoulder. However, higher energies may not be acceptable particularly as the pillar diameter is reduced due to ion induced magnetic damage. The optimal etch angles are more effective at removing redeposited material.

Figure 18:
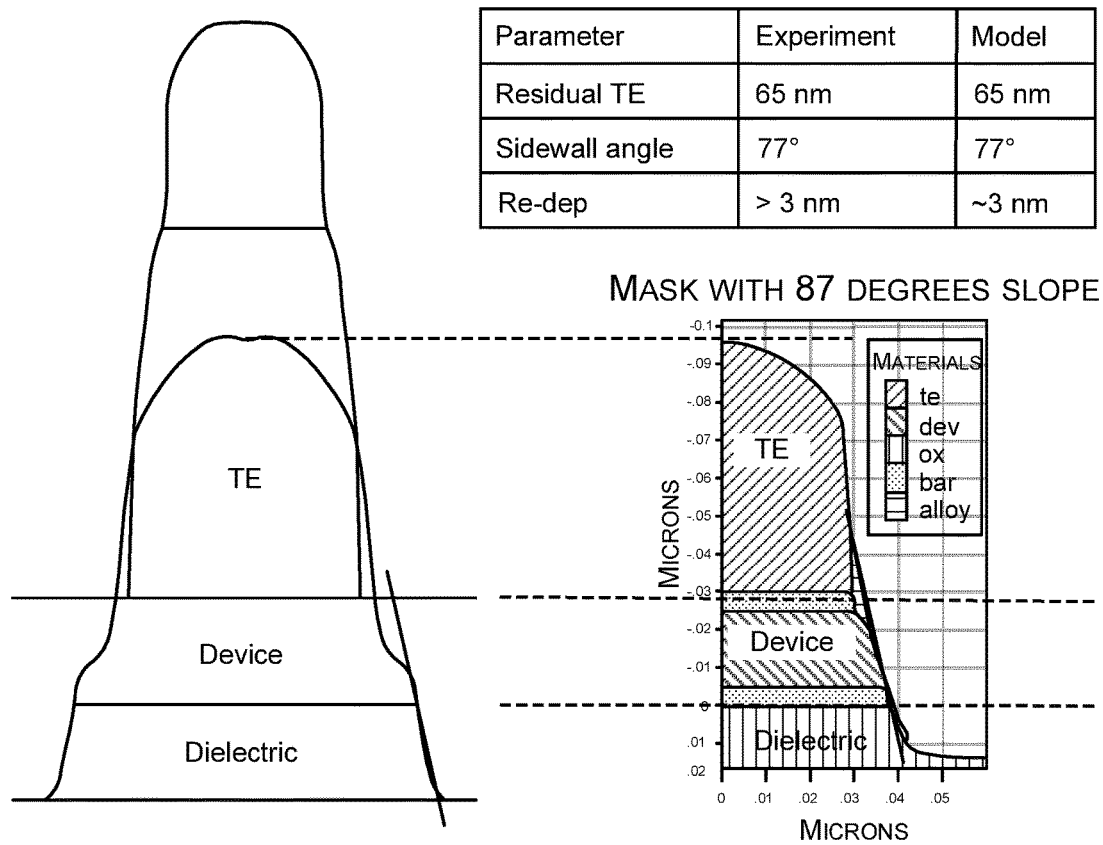
FIG. 18 is a graphical representation of the experimental results obtained versus modeled results.
Figure 19:
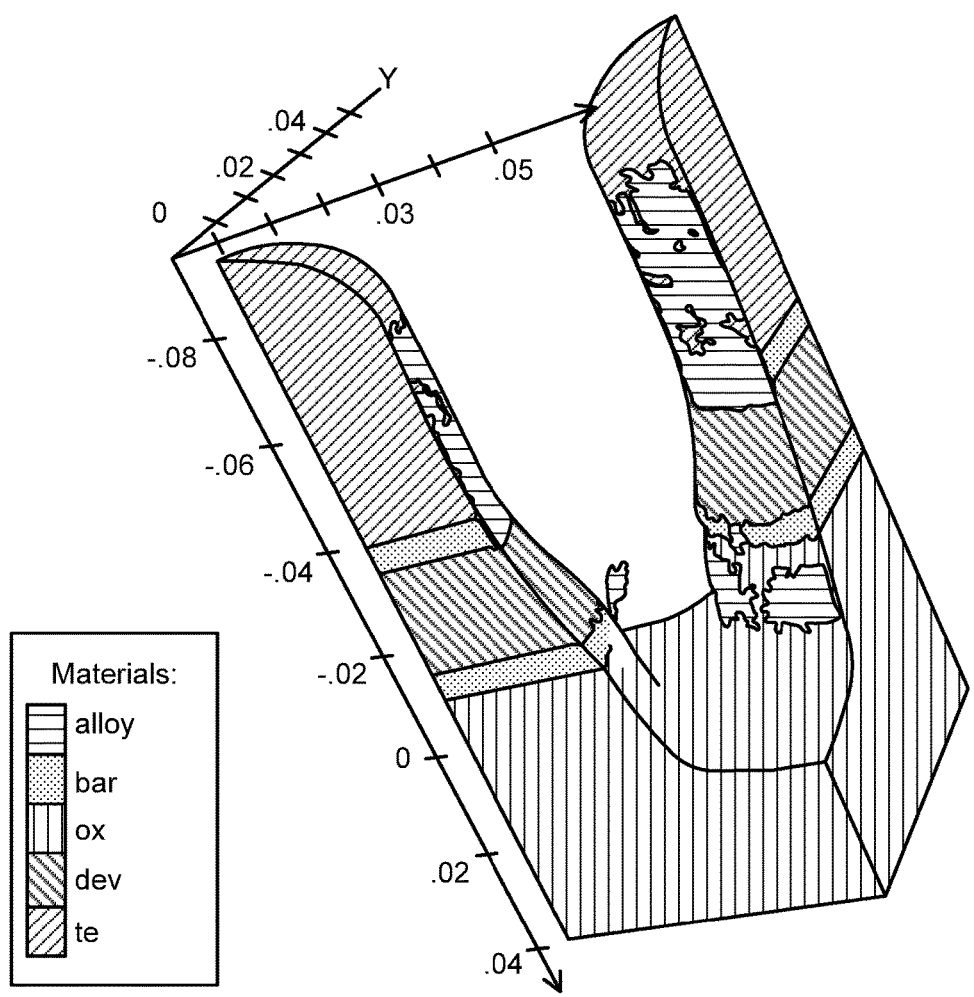
FIG. 19 is a graphical 3-dimensional representation of an STT-RAM structure after the main etch and a redeposition removal etch with continuous rotation.
Figure 20:
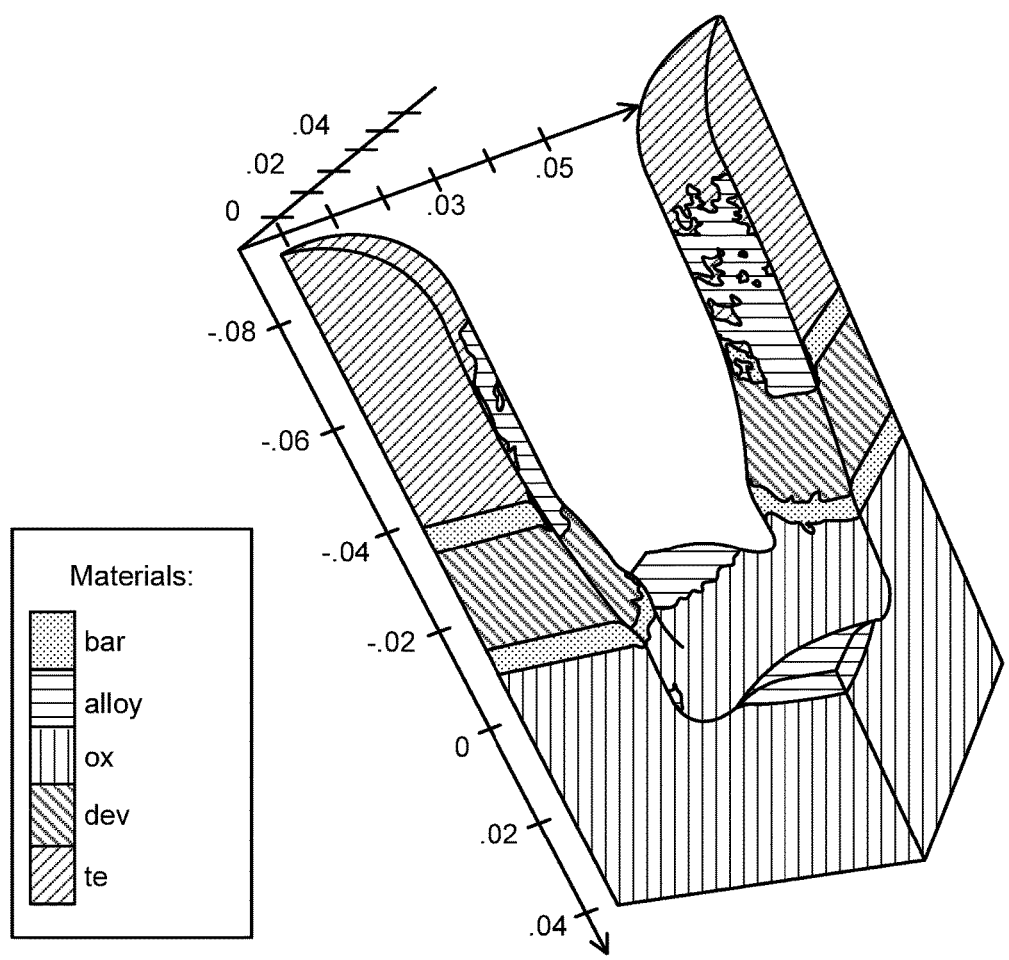
FIG. 20 is a graphical 3-dimensional representation of the STT-RAM structure of FIG. 18 after the main etch and a redeposition removal etch with a windowed mode that uses sweep rotation. In this case, the sweep rotation is performed over a sweep angle centered about 90° increments starting at 0° rotational angle.
Figure 21:
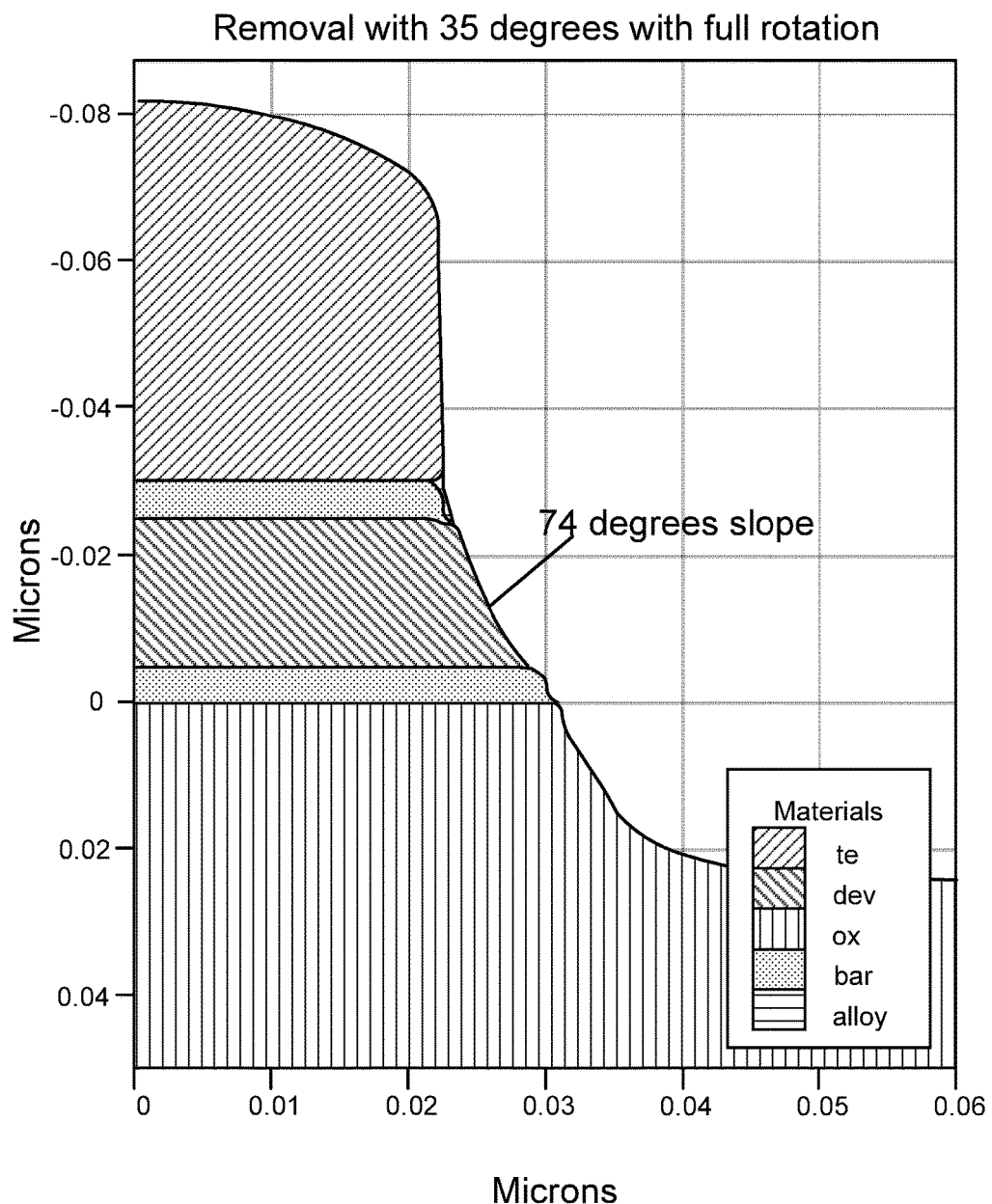
FIG. 21 is a 2-dimensional side view of the ST-RAM structure of FIG. 19.
Figure 22:
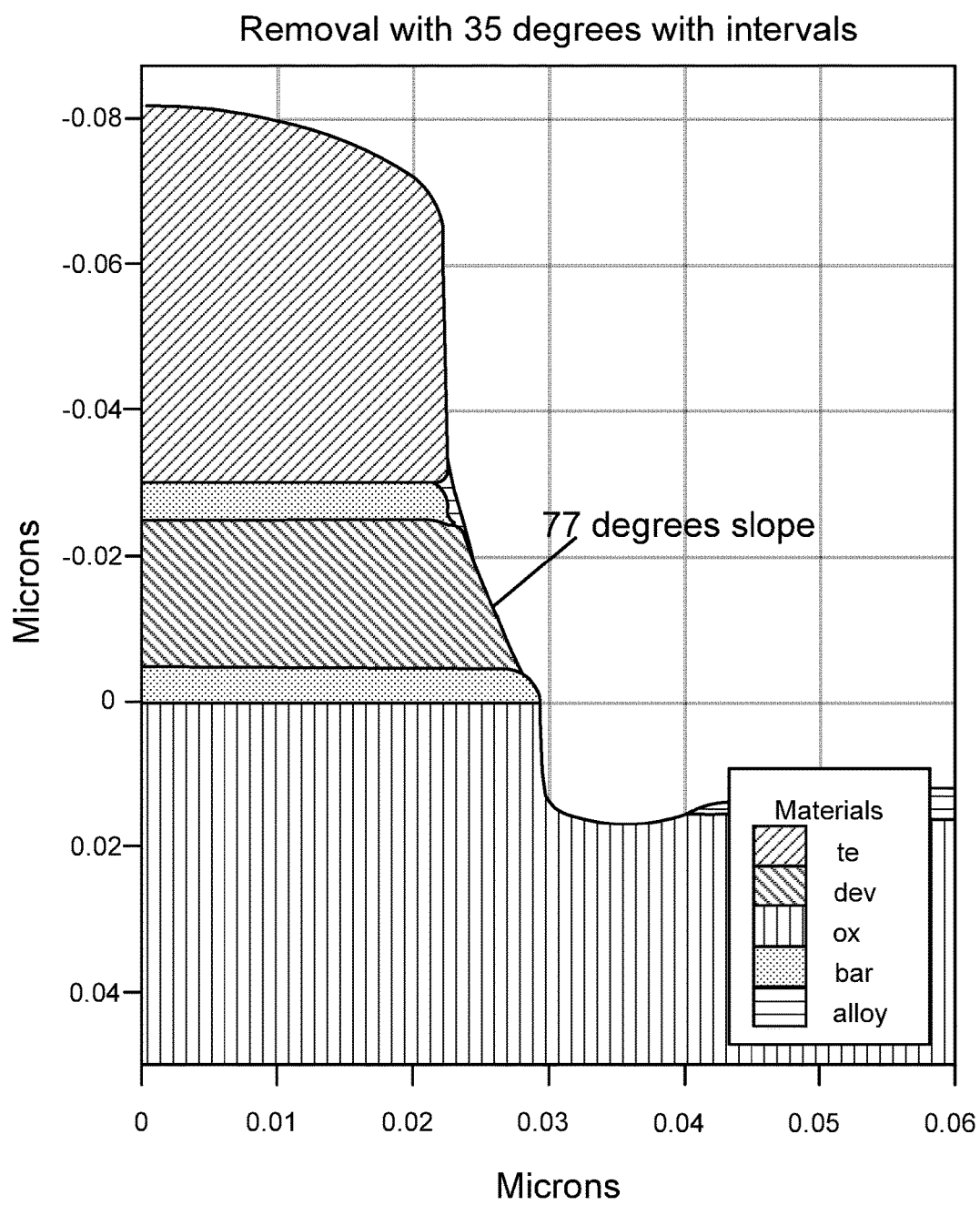
FIG. 22 is a 2-dimensional side view of the ST-RAM structure of FIG. 20.
Figure 23:
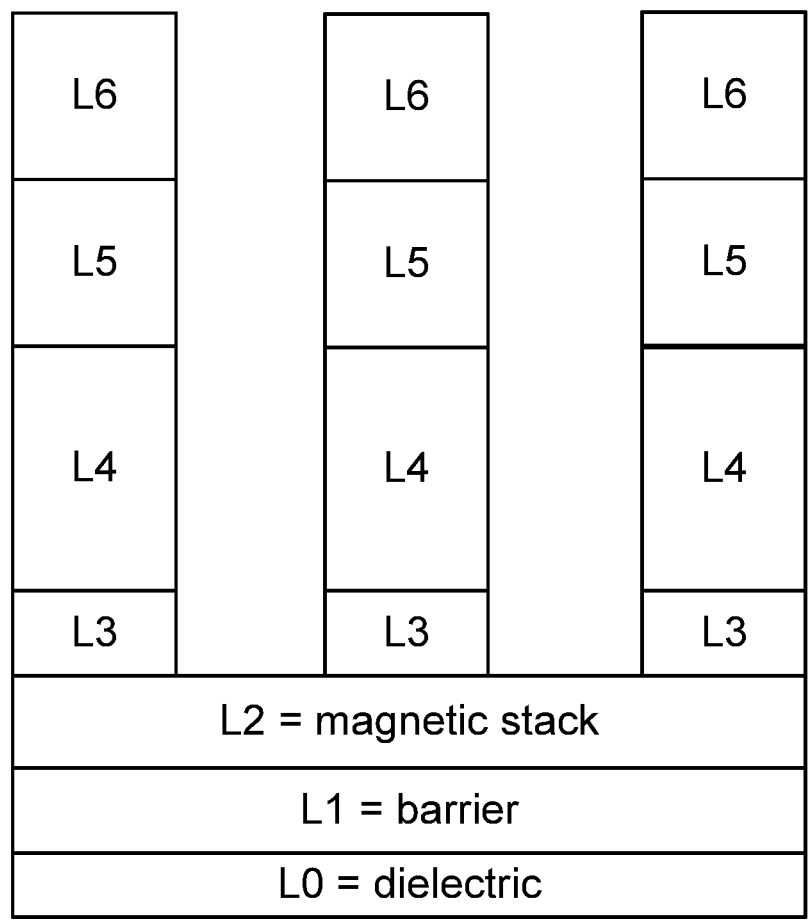
FIG. 23 is a schematic cross-sectional side view of example STT-RAM structures.
Figure 24:
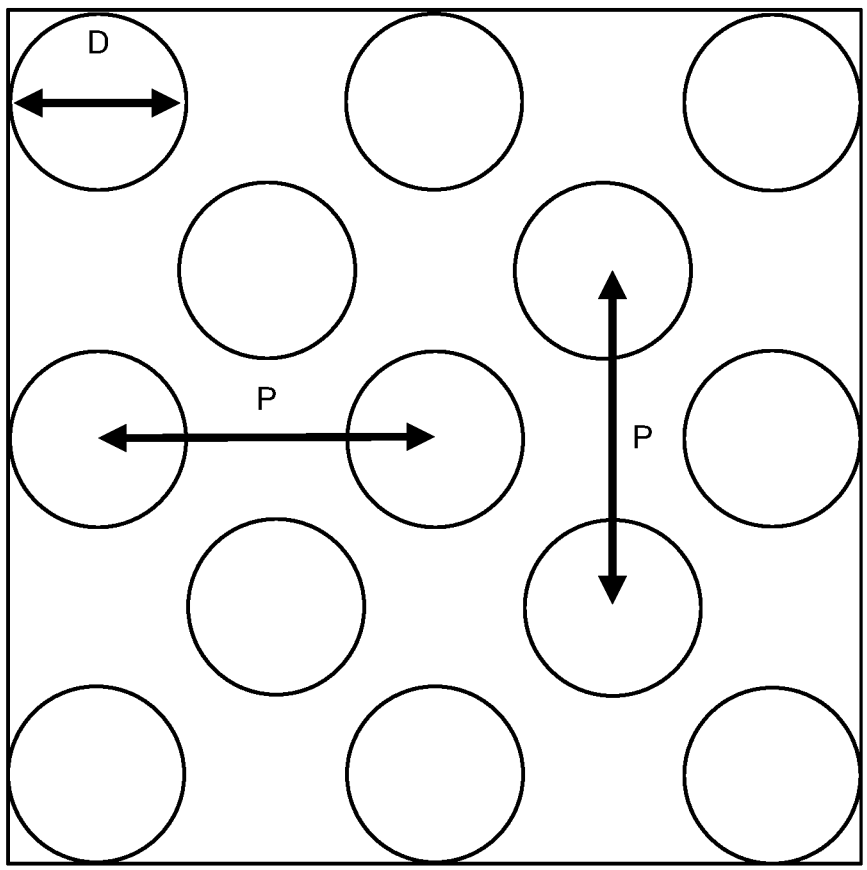
FIG. 24 is a schematic top view of the STT-RAM structures of FIG. 23.

Since ion beam etching is a physical process, the correlation between modeling and experiment is surprisingly good (FIG. 18). The residual top electrode (TE), sidewall angle (SWA) and thickness of redeposition are well predicted.

The model was then used to compare a conventional redeposition removal with a windowed redeposition removal (the results which are shown in FIGS. 19, 20, 21 and 22). With conventional redeposition removal, the redeposition persisted after approximately 30% of over-etch (% of main etch time). The redeposition could not be removed from the bottom of the structure and required a longer etch into the underlying dielectric and the sidewall angle of the device degraded to 74° from 77° after the main etch. In contrast, for the windowed etch where the etching was only performed in a +/−7.5° arc centered around the nominal sweep angles of 45°, 135°, 225° and 315°, the redeposition was mostly removed (e.g., at least 75% was removed, or at least 85% was removed) after 5% of over-etch (% of main etch time) and the sidewall angle was preserved (about 77°). In addition, the sidewall angle in the dielectric became steeper, which is preferred as for tight pitch structures.

The 3D simulation was then extended for a dense pattern (shown in FIG. 19) to evaluate the feasibility of the proposed approach. The etch model included the same effects as before with the following changes:

Structure consisted of a thick underlying dielectric (L0), a blanket barrier (L1=5 nm), a blanket device layer comprising the magnetic stack (L2=25 nm), a patterned top barrier (L3=5 nm), a top electrode layer (L4=45 nm) and mask layers (L5=55 nm of DLC and L6 is 0 nm of SiN). The pillar diameter, D=18 nm @ base, 89° SWA, P=45 nm, resulted in a space of 27 nm.

Main etch angle was 5° to surface normal.

A divergent beam (+/−15°) was used for post-etch redeposition removal.

As before, the outputs of the simulation included etch profile evolution, redeposition, faceting, and mask erosion.

For these narrow, high aspect ratio structures, the effective etch rate of the mask was 3×-4× the etch rate of a blanket film of the same material since the material was etched both vertically and laterally. In contrast, the effective etch rate of the material at the base of the structure was 2× lower than the etch rate of a blanket film of the same material since the ion flux was blocked by the overlying structure. Consequently, it is desired to reduce the mask height as much as possible. By using DLC for the mask, the ion beam etch rate is lower than the other materials in the stack and thus a thinner mask can be used compared to masks using conventional materials such as SiN. In addition, angled deposition of the hard mask can be performed sometime during the etching to revert the sidewall angle of the mask to vertical if it becomes excessively sloped.

Figure 25:
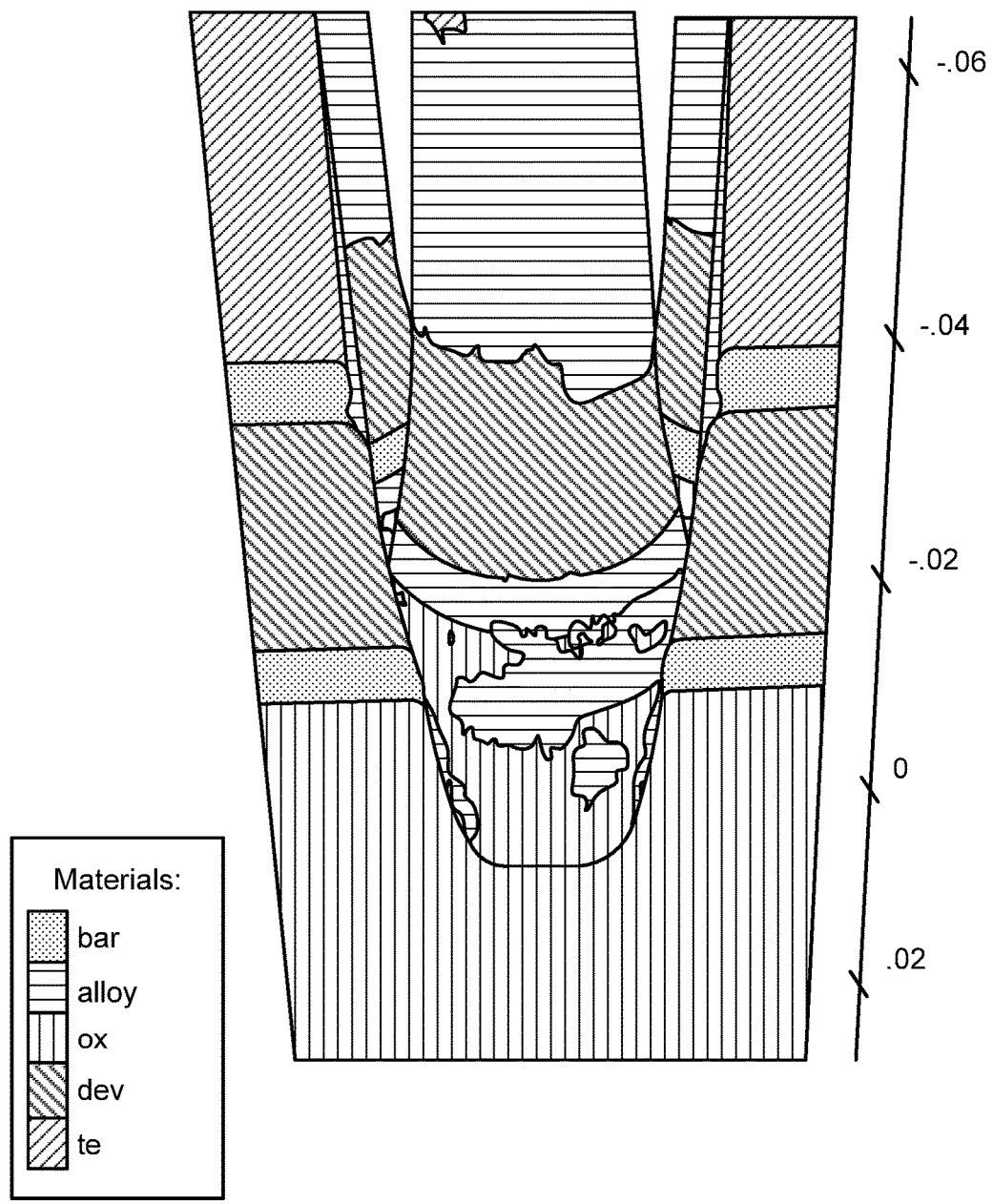
FIG. 25 is a graphical 3-dimensional representation of an STT-RAM structure after the main etch.
Figure 26:
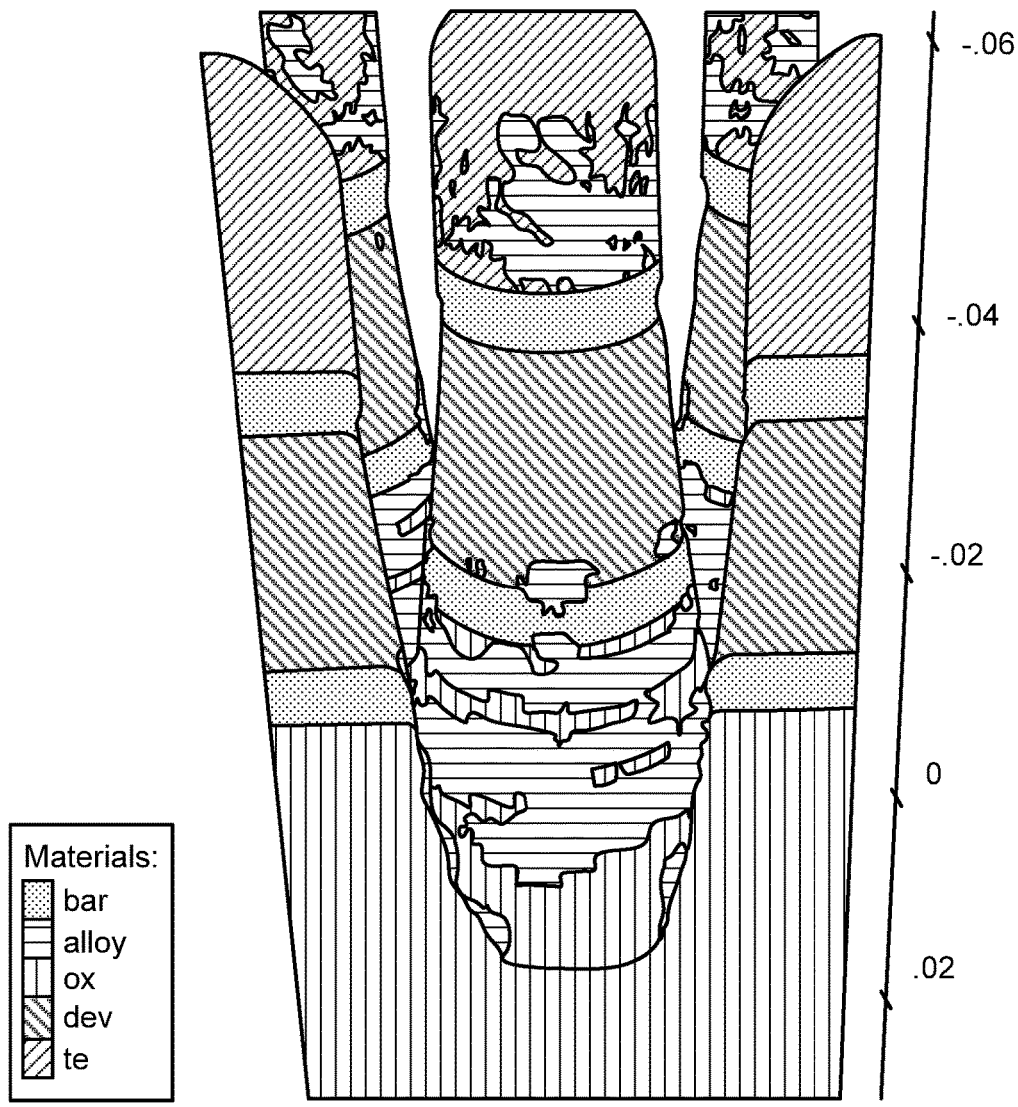
FIG. 26 is a graphical 3-dimensional representation of the STT-RAM structure of FIG. 25 after redeposition removal.

The simulation results (shown in FIGS. 25 and 26) confirm that a dense array can be etched successfully by using a combination of a DLC hard mask, a highly collimated beam, and a near normal etch angle. A clean-up using a very divergent beam removes the redeposition from the surfaces of the magnetic stack which forms the critical portion of the device.

So far, the use of low energies has been stressed to avoid magnetic damage. Low energies are commonly used for ion beam etching of magnetic heads which are particularly susceptible to IBE induced damage. Damage modifies magnetic properties: coercivity, exchange energy, domain formation along perimeter. The sidewall of magnetic heads is tapered which increases depth of damaged region. This damage changes the bias/linearity of the sensor and degrades signal to noise ratio (S/N ratio). In contrast, STT-RAM structures may be less susceptible to damage for a few reasons. The sidewall angle is steeper etch angle and redeposition protects the sidewalls while the sensitive magnetic layers are being etched. In addition, the pillar diameter for second generation STT-RAM structures is relatively large (e.g., about 45 nm) compared to a magnetic head (which is often, e.g., less than 20 nm). Consequently, higher ion beam energies may be used for etching of STT-RAM structures. For example, at an ion energy of 1.5 kV, the etching selectivity differences between the different layers is reduced which results in more vertical sidewalls and reduced redeposition. Any shoulders that are formed due to etching selectivity differences are suppressed, and the accumulation of redeposited material over the shoulder is also reduced. Thus a combination of high energies for the main etch with lower energies for the redeposition removal, clean-up and oxidation steps may be beneficial for such structures.

The above specification, examples, and data provide a complete description of the structure and use of exemplary implementations of the invention. The above description provides specific implementations. It is to be understood that other implementations are contemplated and may be made without departing from the scope or spirit of the present disclosure. The above detailed description, therefore, is not to be taken in a limiting sense. While the present disclosure is not so limited, an appreciation of various aspects of the disclosure will be gained through a discussion of the examples provided.

Unless otherwise indicated, all numbers expressing feature sizes, amounts, and physical properties are to be understood as being modified by the term "about." Accordingly, unless indicated to the contrary, the numerical parameters set forth are approximations that can vary depending upon the desired properties sought to be obtained by those skilled in the art utilizing the teachings disclosed herein.

As used herein, the singular forms "a", "an", and "the" encompass implementations having plural referents, unless the content clearly dictates otherwise. As used in this specification and the appended claims, the term "or" is generally employed in its sense including "and/or" unless the content clearly dictates otherwise.

Spatially related terms, including but not limited to, "lower", "upper", "beneath", "below", "above", "on top", etc., if used herein, are utilized for ease of description to describe spatial relationships of an element(s) to another. Such spatially related terms encompass different orientations of the device in addition to the particular orientations depicted in the figures and described herein. For example, if a structure depicted in the figures is turned over or flipped over, portions previously described as below or beneath other elements would then be above or over those other elements.

Since many implementations of the invention can be made without departing from the spirit and scope of the invention, the invention resides in the claims hereinafter appended. Furthermore, structural features of the different implementations may be combined in yet another implementation without departing from the recited claims.

What is claimed is:

1. A method of fabricating a magnetic tunnel junction (MTJ) device comprising:
    (a) providing an initial structure comprising an MTJ stack;
    (b) etching the structure just past the MTJ stack with etching performed at a near normal incidence angle;
    (c) performing a clean-up etch to remove redeposited material from sidewalls of the MTJ stack that extend from just below the MTJ to just above the MTJ;
    (d) depositing an encapsulation layer over the cleaned up etched sidewalls forming re-entrant encapsulation layer sidewalls;
    (e) etching the remainder of the structure at a near normal incidence angle while ensuring that the encapsulation layer on the sidewalls of the MTJ stack is at least partially preserved;

(f) performing a clean-up etch to remove a majority of redeposited materials from the sidewalls of the MTJ stack; and (g) encapsulating the etched stack.

2. The method of claim 1, wherein the encapsulation layer on the sidewall of the MTJ stack is mostly preserved.

3. The method of claim 2, wherein at least 75% of the encapsulation layer on the sidewall of the MTJ stack is preserved.

4. The method of claim 1, wherein the clean-up etch removes at least 75% of redeposited material from the sidewalls of the MTJ stack.

5. The method of claim 1, wherein depositing an encapsulation layer over the cleaned up etched sidewalls of step (d) comprises depositing diamond like carbon.

6. A method of patterning STT-RAM structures arranged in a square pattern defining a reference orientation of 0°, each STT-RAM structure having a magnetic tunnel junction (MTJ) stack, the method comprising:

(a) etching the structures just past the MTJ stack where the etching is performed at a near normal incidence angle;

(b) performing a clean-up etch at an angle greater than near normal incidence angle to remove redeposited material from sidewalls of the MTJ stack, the projection of the clean-up etch ion beam in the wafer plane being at 90° increments starting at 45° relative to the reference orientation of 0° as defined by the direction of rows in the square pattern when the structure is rotated;

(c) depositing electrically insulating etch stop material over the cleaned up etched MTJ sidewalls to form re-entrant insulating sidewalls;

(d) etching the remainder of the structure at a near normal incidence angle while ensuring that the re-entrant insulating sidewall of the MTJ stack is mostly preserved; and (e) performing a second clean-up etch at an angle greater than near normal incidence to remove a majority of redeposited materials from the sidewalls of the MTJ stack, at 90° increments starting at 45° relative to the reference orientation of 0° when the structure is rotated.

7. The method of claim 6, wherein the clean-up etch of step (b) is performed from just below the MTJ to just above the MTJ.

8. The method of claim 6, further comprising:

(f) encapsulating the etched and cleaned-up stack.

9. The method of claim 6, wherein etching the structure just past the MTJ stack of step (d) is performed is at a 10° or less incidence angle.

10. A method of patterning an STT-RAM structure having a magnetic tunnel junction (MTJ) stack comprising:

(a) providing an initial structure comprising an MTJ stack;

(b) etching the structure to a pre-determined depth to provide etched sidewalls;

(c) depositing an encapsulation layer over the etched sidewalls to form re-entrant encapsulation layer sidewalls; and (d) etching the structure having the encapsulation layer.

11. The method of claim 10, wherein depositing the encapsulation layer of step (c) comprises using a directional deposition method.

12. The method of claim 10, wherein depositing the encapsulation layer of step (c) comprises depositing diamond like carbon (DLC).

13. The method of claim 10 further comprising:

(e) after etching the structure to a pre-determined depth to provide etched sidewalls of step (b) and before depositing the encapsulation layer of step (c), performing a clean-up etch using an ion beam at an angle greater than near normal incidence and within particular angular orientations relative to the initial structure.

14. The method of claim 13, wherein the clean-up etch of step (e) is performed from just below the MTJ to just above the MTJ.

* * * * *